US008379412B2

(12) United States Patent
Nakayama

(10) Patent No.: US 8,379,412 B2
(45) Date of Patent: Feb. 19, 2013

(54) CONVERTER AND CONVERTER CONTROL METHOD

(75) Inventor: Kazuaki Nakayama, Kanagawa (JP)

(73) Assignee: Empire Technology Development LLC, Wilmington ( * ) Notice: Subject to any disclaimer, the term of this patent is extended or adjusted under 35 U.S.C. 154(b) by 273 days.

(21) Appl. No.: 12/999,628

(22) PCT Filed: Aug. 16, 2010

(86) PCT No.: PCT/JP2010/005072
§ 371 (c)(1),
(2), (4) Date: Dec. 16, 2010

(87) PCT Pub. No.: WO2012/023154
PCT Pub. Date: Feb. 23, 2010

(65) Prior Publication Data
US 2012/0039378 A1 Feb. 16, 2012

(51) Int. Cl.
*H02M 3/335* (2006.01)
*H03L 7/06* (2006.01)
*H03D 3/24* (2006.01)
(52) U.S. Cl. ......... 363/21.01; 363/17; 363/98; 327/156; 375/376
(58) Field of Classification Search ............ 363/16, 363/17, 21.01–21.03, 50, 98; 323/235, 319; 327/155–157; 375/376
See application file for complete search history.

(56) References Cited

U.S. PATENT DOCUMENTS

| 5,477,035 | A | | 12/1995 | Matsumoto et al. |
| 5,909,474 | A | * | 6/1999 | Yoshizawa ..................... 375/376 |
| 6,259,755 | B1 | * | 7/2001 | O'Sullivan et al. ............ 375/376 |
| 7,088,594 | B2 | * | 8/2006 | Sase et al. ..................... 363/16 |
| 7,206,343 | B2 | * | 4/2007 | Pearce ............................ 375/238 |
| 7,236,025 | B2 | * | 6/2007 | Takahashi ...................... 327/147 |
| 2005/0040872 | A1 | * | 2/2005 | Kinugasa et al. ............ 327/156 |

(Continued)

FOREIGN PATENT DOCUMENTS

| JP | 06-141554 | 5/1994 |
| JP | 07-022167 | 1/1995 |

(Continued)

OTHER PUBLICATIONS

A doctoral thesis called "Phase-Shifted PWM High-Frequency Switching-Mode Power Conversion Circuits and Systems and Their Applications" (Graduate School of Science and Technology, Kobe University, Jan. 1994).

(Continued)

*Primary Examiner* — Timothy J Dole
*Assistant Examiner* — Yusef Ahmed
(74) *Attorney, Agent, or Firm* — IPUSA, PLLC

(57) ABSTRACT

Techniques are generally described for a converter including a PLL and a pulse deleting circuit. The pulse deleting circuit is configured to delete a pulse from one of the inputs to the PLL when a filtered output in the PLL falls below a first reference level and an unlocked state of the PLL is detected in response to a phase lag of one of the first and second pulse inputs with respect to the other. The pulse deleting circuit may also be configured to delete one pulse of the other of the first and second pulse inputs when the filtered output exceeds a second reference level and the unlocked state of the PLL is detected in response to a phase lead of the one of the first and second pulse inputs with respect to the other.

20 Claims, 29 Drawing Sheets

U.S. PATENT DOCUMENTS

| | | | |
|---|---|---|---|
| 2005/0099827 A1 | 5/2005 | Sase et al. | |
| 2006/0170468 A1* | 8/2006 | Takahashi | 327/156 |
| 2008/0191758 A1* | 8/2008 | Dykstra | 327/157 |
| 2008/0205096 A1* | 8/2008 | Lai et al. | 363/40 |
| 2008/0231332 A1* | 9/2008 | Nakata et al. | 327/147 |
| 2008/0273648 A1* | 11/2008 | Sundby | 375/376 |
| 2010/0164570 A1* | 7/2010 | Priego | 327/157 |
| 2010/0321074 A1* | 12/2010 | Song | 327/157 |

FOREIGN PATENT DOCUMENTS

| | | |
|---|---|---|
| JP | 07-111782 | 4/1995 |
| JP | 07-060735 | 6/1995 |
| JP | 08-008773 | 1/1996 |
| JP | 2002-059094 | 2/2002 |
| JP | 3398172 | 2/2003 |
| JP | 2005-198438 | 7/2005 |

OTHER PUBLICATIONS

A thesis called "Research on High-efficiency and High-performance Semiconductor Power Conversion System Utilizing Resonance and Transient Phenomenon of LC Circuit" (Tokyo Institute of Technology, 1999).

Implementation of a PLL-based High Frequency Resonant AC Power Supply, SICE Annual Conference 2008, Aug. 20-22, 2008, The University Electro-Communications, Japan, 1329-1334.

International Search Report and Written Opinion for International Application No. PCT/JP2010/005072 mailed on Nov. 16, 2010.

* cited by examiner

| Vlf | < V1 | > V2 |
|---|---|---|
| IN-1 | DELETE  | INSERT  |
| IN-2 | INSERT  | DELETE  |

CONVERTER AND CONVERTER CONTROL METHOD

TECHNICAL FIELD

The disclosure generally relates to converters and converter control methods.

BACKGROUND

Unless otherwise indicated herein, the approaches described in this section are not prior art to the claims in this application and are not admitted to be prior art by inclusion in this section.

In recent years, the trend of power converters, including inverters and converters, have shifted to the so-called resonant power converters. Resonant power converters generally employ ZVS (Zero-Voltage Switching) or ZCS (Zero-Current Switching) in order to improve the conversion efficiency by reducing power loss, radiation noise, or transmission noise.

In some cases, the resonant power converter may employ PFM (Pulse-Frequency Modulation) for negative feedback control in order to utilize a portion of the resonant impedance curve representing the property of the resonant power converter or the converter circuit thereof. However, such PFM resonant power converters may not carry out a sufficient control with respect to power supply fluctuations or changes in load that occur in a relatively wide range.

On the other hand, resonant power converters that use PWM (Pulse-Width Modulation) for negative feedback control may provide an easier control than PFM negative feedback control. However, the output of such PWM resonant power converters may sharply decrease or the conversion efficiency of the resonant power converter may deteriorate if a slight mismatch occurs between the resonant frequency and the switching frequency of the resonant power converter.

Various techniques have been proposed to accurately match the switching frequency and the resonant frequency of the resonant power converter by utilizing a PLL (Phase-Locked Loop) in combination with the PWM, PFM or PDM (Pulse Density Modulation).

However, the PLL may operate on a precondition that regular and continuous input pulses are input to a PFD (Pulse-Frequency Detector). In such a PLL, an erroneous operation may be carried out in response to induced noised caused by electrostatic coupling, or electromagnetic coupling, or irregular discontinuities in the input pulses caused by power supply fluctuations or changes in load. The induced noise may include mixing of surge pulses caused by ringing or overshoot. The output of the resonant power converter may sharply decrease if a relatively long recovery time is required to stop the erroneous operation.

The erroneous operation of the resonant power converter may likely occur if the resonant power converter is configured to produce a relatively large output and a PLL part and a power switching part are located relatively close to each other, or a plurality of power switching parts are located on a single substrate or board in order to reduce the size of the resonant power converter.

The decrease in the output of the resonant power converter, caused by a relatively short discontinuity on the order of approximately several hundred μsec to approximately several msec in the input pulses to the PFD of the resonant power converter, may be recovered by a sample-and-hold function of a LPF (Low-Pass Filter) coupled to an output end of the PFD. However, the recovery utilizing the LPF may not be possible if the discontinuity in the input pulses of the PFD is longer, that is, on the order of approximately several tens of msec or longer. A relatively expensive digital signal processing circuit may be required for the recovery in the latter case.

SUMMARY

Accordingly, this disclosure generally describes example embodiments to provide a novel and useful converter and converter control method, which may produce a relatively stable output regardless of power supply fluctuations, changes in load, or noise.

According to some example embodiments, a converter may include a PLL (Phase-Locked Loop) circuit including a detector circuit, a lock detection circuit, a filter circuit and an oscillator circuit, wherein the detector circuit is configured to detect a phase error between a first pulse input and a second pulse input and to generate an error signal indicative of the detected phase error, the filter circuit is configured to filter the error signal and to provide a filtered error signal, the lock detection circuit is configured to detect a locked or unlocked state of the PLL circuit in response to the error signal, and the oscillator circuit is configured to produce an oscillator output signal in response to the filtered error signal; a pulse control circuit configured to receive the oscillator output signal and a feedback signal, and to generate a drive signal in response thereto; a comparator circuit configured to receive and evaluate the filtered error signal to determine when the filtered error signal either falls below a first reference level or exceeds a second reference level that is higher than the first reference level; and a pulse deleting circuit configured to receive the drive signal and to provide the first pulse input in response thereto, and also configured to receive a resonant current measurement from a primary side of a transformer circuit and to provide the second pulse input in response thereto, wherein the pulse deleting circuit is configured to delete one pulse of one of the first and second pulse inputs when the comparator circuit detects the filtered error signal falling below the first reference level and the lock detection circuit detects the unlocked state in response to a phase lag of the one of the first and second pulse inputs with respect to the other of the first and second pulse inputs detected by the detector circuit, and wherein the pulse deleting circuit is configured to delete one pulse of the other of the first and second pulse inputs when the comparator circuit detects that the filtered error signal exceeds the second reference level and the lock detection circuit detects the unlocked state in response to a phase lead of the one of the first and second pulse inputs with respect to the other of the first and second pulse inputs detected by the detector circuit.

According to some example embodiments, a method to control a converter, includes receiving, by a pulse deleting circuit, a drive signal from a pulse control circuit and supplying a first pulse input in response thereto; receiving, by the pulse deleting circuit, a resonant current from a primary side of a transformer circuit and supplying a second pulse input in response thereto; detecting, by a comparator circuit, when a filtered error signal of a PLL (Phase-Locked Loop) circuit falls below a first reference level and asserting a first control signal in response thereto; detecting, by the comparator circuit, when the filtered error signal of the PLL circuit exceeds a second reference level that is higher than the first reference level, and asserting a second control signal in response thereto; detecting, by a lock detection circuit of the PLL circuit, an unlocked state of the PLL circuit in response to a phase lag or phase lead of one of the first and second pulse inputs with respect to the other of the first and second pulse inputs and asserting an unlock detection signal in response thereto; deleting, by the pulse deleting circuit, one pulse of one of the first and second pulse inputs based on the control signal and the lock detection signal from the PLL circuit when the first control signal and the unlock detection signal are both asserted; and deleting, by the pulse deleting circuit, one pulse of the other of the first and second pulse inputs based on the control signal and the lock detection circuit from the PLL circuit when the second control signal and the unlock signal are both asserted.

According to some example embodiments, a method to control a converter including a PLL (Phase-Locked Loop), may include deleting one pulse of one of first and second pulse inputs to the PLL when a filtered output obtained through phase detection in the PLL falls below a first reference level and an unlocked state of the PLL is detected in response to a phase lag of one of the first and second pulse inputs with respect to the other; and deleting one pulse of the other of the first and second pulse inputs when the filtered output exceeds a second reference level and the unlocked state of the PLL is detected in response to a phase lead of the one of the first and second pulse inputs with respect to the other.

The foregoing summary is illustrative only and is not intended to be in any way limiting. In addition to the illustrative aspects, embodiments, and features described above, further aspects, embodiments, and further features will be apparent from the following detailed description when read in conjunction with the accompanying drawings.

DETAILED DESCRIPTION

Figure 1:
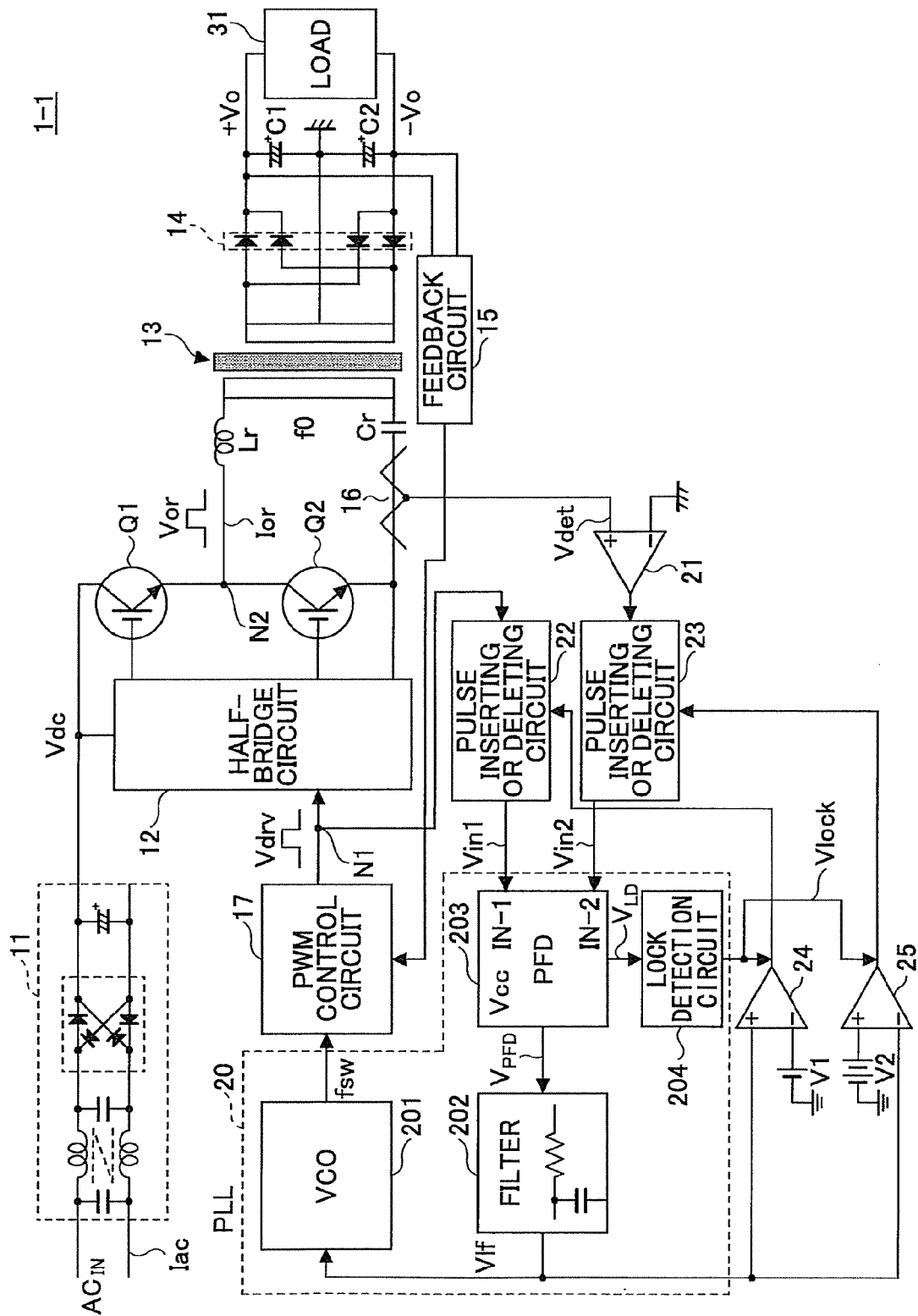
FIG. 1 is a block diagram illustrating an example of a power converter.

In the following detailed description, reference is made to the accompanying drawings, which form a part hereof. In the drawings, similar symbols typically identify similar components, unless context dictates otherwise. The illustrative examples or embodiments described in the detailed description, drawings, and claims are not meant to be limiting. Other examples or embodiments may be utilized, and other changes may be made, without departing from the spirit or scope of the subject matter presented here. It may be readily understood that aspects of this disclosure, as generally described herein, and illustrated in the Figures, may be arranged, substituted, combined, and designed in a wide variety of different configurations, all of which are explicitly contemplated and make part of this disclosure.

This disclosure is drawn, inter alia, to methods, devices, and/or systems related to converters and converter control methods or methods to control converters.

Briefly stated, techniques are generally described herein for a converter including a PLL and a pulse deleting circuit. The pulse deleting circuit is configured to delete a pulse from one of the inputs to the PLL when a filtered output in the PLL falls below a first reference level and an unlocked state of the PLL is detected in response to a phase lag of one of the first and second pulse inputs with respect to the other. The pulse deleting circuit may also be configured to delete one pulse of the other of the first and second pulse inputs when the filtered output exceeds a second reference level and the unlocked state of the PLL is detected in response to a phase lead of the one of the first and second pulse inputs with respect to the other.

FIG. 1 is a block diagram illustrating an example of a power converter, employing an example of a converter control method, in accordance with at least some embodiments of the present disclosure. In this example, the power converter may be formed by a half-bridge resonant AC/DC converter 1-1.

The converter 1-1 illustrated in FIG. 1 includes a primary rectifier circuit 11, a half-bridge driver circuit 12, switching elements Q1 and Q2, a resonant coil (or leakage inductance) Lr, a resonant capacitor Cr, an isolating transformer circuit 13, a secondary rectifier circuit 14, secondary smoothing capacitors C1 and C2, a feedback circuit 15, a current detection circuit 16, a PWM (Pulse Width Modulation) control circuit 17, a PLL (Phase-Locked Loop) circuit 20, a comparator circuit 21, pulse inserting or deleting circuits 22 and 23, and level comparators 24 and 25. The switching elements Q1 and Q2 may form a switching circuit. The level comparators 24 and 25 may form a comparator circuit. The PWM control circuit 17 may form a pulse control circuit. A resonant frequency f0 of the converter 1-1 may be $\frac{1}{2}\pi[(Lr \cdot Cr)]^{1/2}$, where Lr denotes the inductance of the resonant coil Lr and Cr denotes the capacitance of the resonant capacitor Cr. The turns ratio of the isolating transformer circuit 13 may be 1:1, for example.

In FIG. 1, an inverting input terminal of each of the comparator circuit 21 and the comparators 24 and 25 is indicated by a symbol "−", and a non-inverting input terminal of each of the comparator circuit 21 and the comparators 24 and 25 is indicated by a symbol "+".

Any known suitable circuit structures may be used for the primary rectifier 11, which is configured to receive an AC voltage $AC_{IN}$ from an AC power supply (not illustrated). The primary rectifier 11 is not limited to the circuit structure illustrated in FIG. 1. An AC power supply (not illustrated) may supply an AC voltage $AC_{IN}$ of 100 V/50 Hz, for example. The switching elements Q1 and Q2 may be formed by transistors such as Field Effect Transistors (FETs) or Bipolar Junction Transistors (BJTs). Example FETs include MOSFETs (Metal Oxide Semiconductor Field Effect Transistors), CMOSFETs (Complementary MOSFETs), JFETs (Junction FETs), MOSFETs (Metal Semiconductor FETs), or the like. Example BJTs include IGBTs (Insulated Gate Bipolar Transistors), HBTs (Heterojunction Bipolar Transistors), or the like.

The current detection circuit 16 is configured to output a detection voltage Vdet that may be supplied to an input of the comparator circuit 21, and the other input of the comparator circuit 21 may be grounded to a ground potential GND. The current detection circuit 16 provides a resonant current measurement from a primary side of the isolating transformer circuit 13. In some examples the current detection circuit 16 may be formed by a current transformer, a resistor circuit or the like.

The resonant coil Lr and the resonant capacitor Cr may be configured as a resonant circuit located on a secondary side of the isolating transformer circuit 13. In some examples, resonant coil Lr may be formed by a leakage inductance of the isolating transformer circuit 13.

The converter 1-1 may be configured to couple a DC voltage ±Vo to a load 31 having a certain impedance.

The PLL circuit 20 includes a VCO (Voltage Controller Oscillator) circuit 201, a loop filter circuit (or LPF (Low-Pass Filter) circuit) 202, a PFD (Phase Frequency Detector) circuit 203, and a lock detection circuit 204. As described hereunder, the PFD circuit 203 is configured to detect a phase error between pulse inputs Vin1 and Vin2 that are input to input terminals IN-1 and IN-2 thereof, and the lock detection circuit 204 is configured to detect a locked or an unlocked state of the PLL circuit 20 in response to the phase error detected by the RFD circuit 203.

The comparator 24 is configured to receive a reference voltage V1, and the comparator 25 is configured to receive a reference voltage V2 (V2>V1). In a case where open-collector comparators are used for the comparators 24 and 25, the pulse inserting or deleting circuits 22 and 23 may be formed by resistor circuits.

The PWM control circuit 17 may be provided within an IC (Integrated Circuit) chip. In this case, an internal oscillator of the IC chip may be used for the VCO circuit 201 of the PLL circuit 20.

The converter 1-1 employs a half-bridge structure and provide the half-bridge driver circuit 12. However, the converter 1-1 may employ a full-bridge structure and provide a full-bridge driver circuit in place of the half-bridge driver circuit 12.

A rectified DC voltage Vdc may be supplied to the half-bridge driver circuit 12 and the switching element Q1, and high-frequency power may be transmitted to the secondary side of the isolating transformer circuit 13 by alternately switching the ON/OFF states of the switching elements Q1 and Q2 at a switching frequency fsw. Hence, the secondary rectifier circuit 14 and the secondary smoothing capacitors C1 and C2 are configured to apply a converted voltage, that is, the DC voltage ±Vo, to the load 31. The feedback circuit 15 may be configured to provide a negative feedback by a feedback signal to the PWM control circuit 17 in response to an output of the secondary smoothing capacitors C1 and C2, and also configured to adjust the pulse width in order to maintain the DC voltage ±Vo at an approximately constant value regardless of the size of the load 31.

The power transmission efficiency of the converter 1-1 may reach a maximum value when the switching frequency fsw is equal to the resonant frequency f0. On the other hand, a slight difference (or error) on the order of several % between the switching frequency fsw and the resonant frequency f0 may deteriorate the power transmission efficiency to one-half, for example. Hence, the PLL circuit 20 is configured to adjust the switching frequency fsw in order to converge this slight difference to zero (0), even if inconsistencies exist in the inductance of the resonant coil Lr and the capacitance of the resonant capacitor Cr. Such inconsistencies, that is, deviations from designed values, may be generated during production stages of the resonant coil Lr and the resonant capacitor Cr.

Once a locked state is achieved, the PLL circuit 20 is configured to monitor and adjust the switching frequency fsw to become substantially equal to the resonant frequency f0, provided that the two pulse inputs Vin1 and Vin2 to the PFD circuit 203 are regular and continuous. If one of the two pulse inputs Vin1 and Vin2 becomes discontinuous, or an odd or surplus noise pulse mixes into at least one of the two pulse inputs Vin1 and Vin2 to switch the order of the alternating input, a direction in which a DC output Vlf of the loop filter circuit 202 changes (that is, increases or decreases in amplitude) may be reversed by such a disturbance to thereby cause the PLL circuit 20 to unlock from the locked state and sharply decrease the output of the converter 1-1. The DC output (also referred to as a filtered error signal, or a filtered output) Vlf of the loop filter circuit 202 corresponds to an average of an output (or error signal) $V_{PFD}$ of the PFD circuit 203 which is configured to detect the phase error between the pulse inputs Vin1 and Vin2 and to provide the output $V_{PFD}$ indicative of the phase error. The output of the converter 1-1 after sharply decreasing may unlikely resume its original level unless a recovery process is carried out with respect to the disturbance, or a further disturbance in effect cancels the previous disturbance.

Hence, in this example, a rising edge-triggered pulse signal having substantially the same phase as the output of the switching elements Q1 and Q2 may be input to the pulse inserting or deleting circuit 22 from a node N1. On the other hand, a rising edge-triggered pulse signal having a rising edge occurring about the zero-crossing time of a primary side resonant current Ior may be input to the pulse inserting and deleting circuit 23 from the comparator circuit 21. The amplitude of the DC output Vlf of the loop filter circuit 202 may increase, resulting in an increase in the switching frequency fsw, when the phase of the pulse input Vin2 is advanced with respect to the pulse input Vin1. The amplitude of the DC output Vlf of the loop filter circuit 202 may decrease, resulting in a decrease in the switching frequency fsw, when the phase of the pulse input Vin2 lags with respect to the pulse input Vin1.

Figure 2:
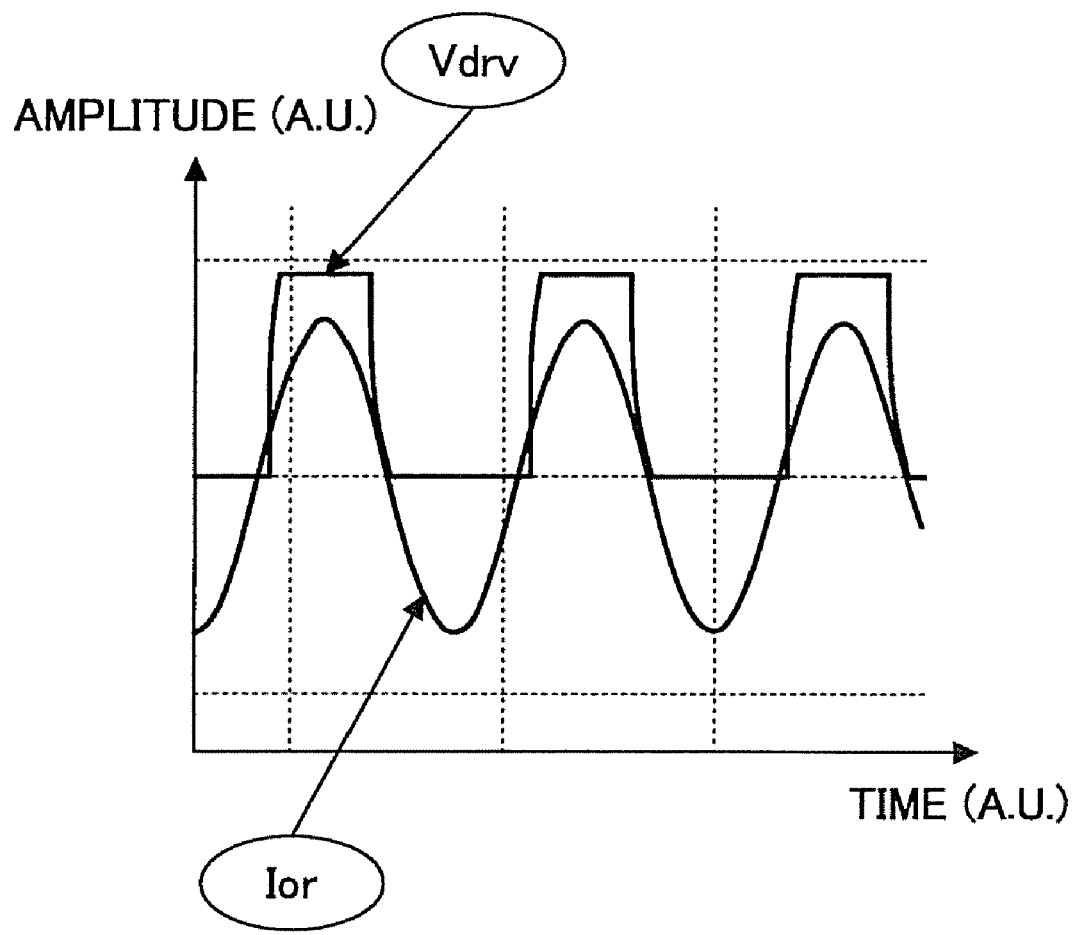
FIG. 2 is a diagram illustrating a relationship of a resonant current and a drive voltage.

Because a control may be carried out to adjust the phase error to become substantially zero (0) between the pulse inputs Vin1 and Vin2, the resonant frequency f0 and the switching frequency fsw may be adjusted to substantially match even if the resonant frequency f0 varies depending on the load 31. As a result, a point in time when the zero-crossing of the resonant current Ior towards the positive direction occurs substantially matches a point in time when the voltage rise occurs at the node N1 to achieve a ZCS (Zero-Current Switching) operation, as illustrated in FIG. 2. FIG. 2 is a diagram illustrating a relationship of the resonant current Ior and a drive voltage Vdrv at the node N1 input to the half-bridge driver circuit 12. In FIG. 2, the ordinate indicates the voltage or current amplitude in A.U. (Arbitrary Units), and the abscissa indicates the time in A.U. The switching frequency fsw may be varied in the varying range of the resonant frequency f0 plus approximately 20% to approximately 30%, for example.

In some examples, a noise pulse may mix into the pulse input Vin1 between two successive pulses of the pulse input Vin1. In this case, the PFD circuit 203 may instantaneously and erroneously determine a phase lag of the pulse input Vin2, and the direction in which the DC output Vlf of the loop filter circuit 202 changes may reverse and thus unlock the PLL circuit 20 from the locked state. In this unlocked state, the DC output Vlf of the loop filter circuit 202 may decrease in amplitude and approach a low power supply limit of the PFD circuit 203 (e.g., 0V), resulting in the switching frequency fsw approaching a lower limit thereof. This limit is predominately due to the limited range of operation of the PFD circuit 203, which limits the DC output Vlf of the loop filter circuit 202 within the power supply range (e.g., a range of about 0 V to about 5 V). Thus, when the DC output Vlf approaches a value of the reference voltage V1 or less, where the reference voltage V1 may be 0.5 V to 1 V, the pulse inserting or deleting circuit 22 may delete one pulse from (or insert a zero-pulse or a low-level pulse to) the pulse input Vin1 supplied to the PFD circuit 203. The comparator 24 is configured to receive and evaluate the DC output (or filtered error signal) Vlf of the loop filter circuit 202 to determine when the DC output Vlf becomes the first reference voltage V1 or lower. The pulse inserting or deleting circuit 22 may delete one pulse in response to the output of the comparator 24 that may be activated by an output (or unlock detection signal) Vlock of the lock detection circuit 204 which detects an unlocked state of the PLL circuit 20. At substantially the same time, the pulse inserting or deleting circuit 23 may be inactive (or inhibited) during this time. The pulse inserting or deleting circuit 23 may be inactive in response to the output of the comparator 25 that may be inhibited by the output Vlock of the lock detection circuit 204 which detects an unlocked state of the PLL circuit 20. As a result of deleting one pulse as described above, the PFD circuit 203 may rapidly recover and the DC output Vlf of the loop filter circuit 202 may return to the amplitude before the amplitude decrease, to thereby return the PLL circuit 20 to the locked state. The quicker the response of the loop filter circuit 202, the shorter the recovery time of the PLL circuit 20.

In some examples, one pulse of the pulse input Vin1 may drop out due to power supply fluctuations, noise or other externally generated disturbances. In this case, the PFD circuit 203 may instantaneously and erroneously determine a phase advance of the pulse input Vin2, and the direction in which the DC output Vlf of the loop filter circuit 202 changes may reverse to unlock the PLL circuit 20 from the locked state. In this unlocked state, the DC output Vlf of the loop filter circuit 202 may increase in amplitude and approach the power supply voltage (e.g., 5 V) of the PFD circuit 203, resulting in the switching frequency fsw approaching an upper limit thereof. Again, it is predominately due to the limited range of operation of the PFD circuit 203, which limits the DC output Vlf of the loop filter circuit 202 within the power supply range (e.g., a range of about 0 V to about 5 V). Thus, when the DC output Vlf approaches a value of the reference voltage V2 or greater, (e.g., a reference voltage V2 may in a range of about 3.5 V to about 4 V) the pulse inserting or deleting circuit 23 may delete one pulse from (or inserts a zero-pulse or a low-level pulse to) the pulse input Vin2 supplied to the PFD circuit 203. The comparator 25 is configured to receive and evaluate the DC output (or filtered error signal) Vlf of the loop filter circuit 202 to determine when the filtered error signal becomes the second reference voltage V2 or higher. The pulse inserting or deleting circuit 23 may delete one pulse in response to the output of the comparator 25 that may be activated by the output Vlock of the lock detection circuit 204 which detects an unlocked state of the PLL circuit 20. At substantially same time, the output Vlock of the lock detection circuit 204 detects an unlocked state of the PLL circuit 20, which in turn inhibits the output of comparator 24 such that the pulse inserting or deleting circuit 22 may be inactive (or inhibited). As a result of deleting one pulse as described above, the PFD circuit 203 may rapidly recover and the DC output Vlf of the loop filter circuit 202 may return to the amplitude before the amplitude increase, to thereby return, the PLL circuit 20 to the locked state. Again, the quicker the response of the loop filter circuit 202, the shorter the recovery time of the PLL circuit 20.

Of course, an operation similar to the operation described above may be carried out when a noise pulse mixes into the pulse input Vin2 between two successive pulses of the pulse input Vin2, or one pulse of the pulse input Vin2 drops out.

In some examples, it is assumed for the sake of convenience that an oscillation frequency fosc of the VCO circuit 201 is substantially equal to the switching frequency fsw. However, the oscillation frequency fosc of the VCO circuit 201 may be a multiple of switching frequency fsw (e.g., n times the switching frequency fsw). In this case, a 1/n frequency division may be carried out before supplying the oscillator output signal of the VCO circuit 201 to the PWM control circuit 17.

Figure 3:
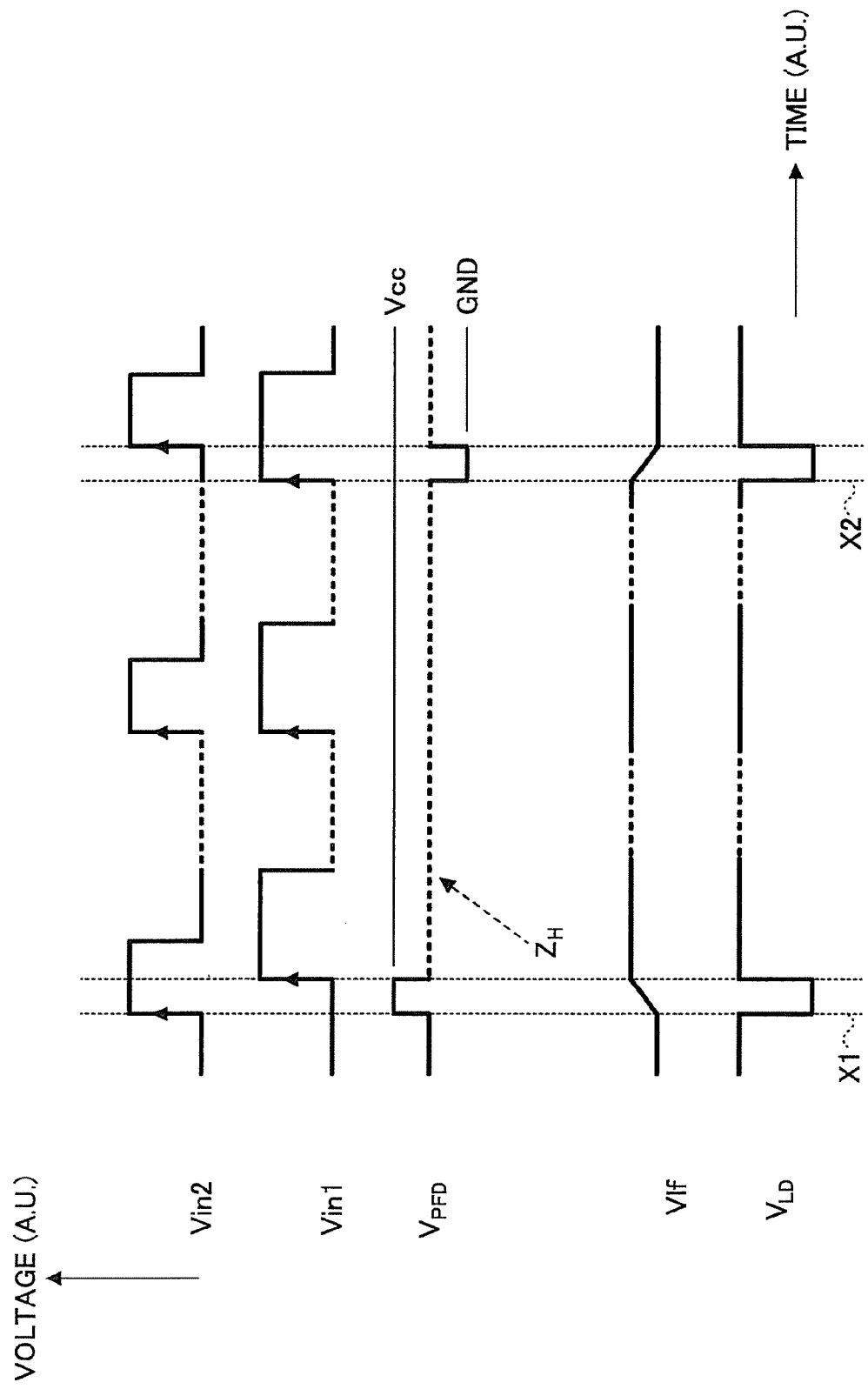
FIG. 3 is a diagram illustrating signal waveforms in a PLL circuit.

FIG. 3 is a diagram illustrating signal waveforms in the PLL circuit 20. In FIG. 3, the ordinate indicates the voltage in A.U., and the abscissa indicates the time in A.U. $Z_H$ indicates a high-impedance OFF state. FIG. 3 illustrates the pulse inputs Vin2 and Vin1 to the PFD circuit 203, the output $V_{PFD}$ of the PFD circuit 203 supplied to the loop filter circuit 202, the DC output Vlf of the loop filter circuit 202, and the output $V_{LD}$ of the PFD circuit 203 supplied to the lock detection circuit 204. As indicated by X1 in FIG. 3, when the phase of the pulse input Vin2 (or resonant current Ior) advances with respect to the pulse input Vin1, the DC output Vlf of the loop filter circuit 202 may increase in amplitude, and the lock detection circuit 204 may respond thereto. On the other hand, as indicated by X2 in FIG. 3, when the phase of the pulse input Vin1 (or drive voltage Vdrv) advances with respect to the pulse input Vin2, the DC output Vlf of the loop filter circuit 202 may decrease in amplitude, and the lock detection circuit 204 may respond thereto.

Figure 4:
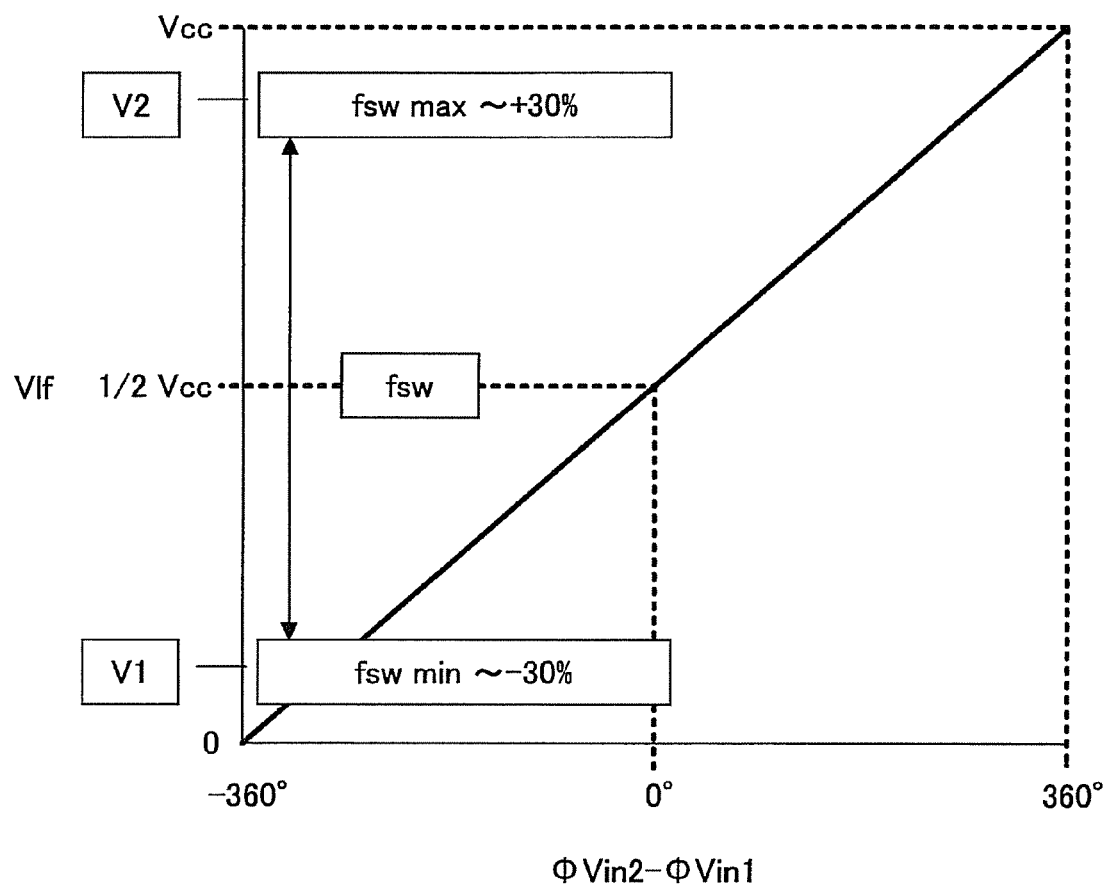
FIG. 4 is a diagram for explaining a phase error between pulse inputs Vin1 and Vin2.

FIG. 4 is a diagram for explaining the phase error between the pulse inputs Vin1 and Vin2. In FIG. 4, the ordinate indicates the DC output Vlf in A.U., and the abscissa indicate the phase error $\emptyset_{Vin2}-\emptyset_{Vin1}$ between the pulse inputs Vin1 and Vin2. FIG. 4 illustrates that the phase error $\emptyset_{Vin2}-\emptyset_{Vin1}$ is zero (0) when the DC output Vlf is ½ the power supply voltage Vcc, and that the switching frequency fsw may increase from a minimum minus up to 30% to a maximum plus up to 30% as the DC output Vlf varies from the reference voltage V1 to the reference voltage V2.

In other words, FIG. 4 illustrates that in a case where the phase of the pulse input Vin2 (or resonant current Ior) advances with respect to the pulse input Vin1 (or drive voltage Vdrv), the DC output Vlf may increase in amplitude and the switching frequency fsw may increase. This case corresponds to a state where the switching frequency fsw is instantaneously lower than the resonant frequency f0 of the resonant coil Lr and the resonant capacitor Cr. On the other hand, FIG. 4 also illustrates that in a case where the phase of the pulse input Vin2 (or resonant current Ior) lags with respect to the pulse input Vin1 (or drive voltage Vdrv), the DC output Vlf may decrease in amplitude and the switching frequency fsw may decrease. This latter case corresponds to a state where the switching frequency fsw is instantaneously higher than the resonant frequency f0 of the resonant coil Lr and the resonant capacitor Cr.

Hence, the feedback loop may function to match the rising edges of the pulse inputs Vin1 and Vin2 in order to make the phase error $\emptyset_{Vin2}-\emptyset_{Vin1}$ zero (0) therebetween, and to control the PLL circuit 20 in the locked state. In this locked state, the zero-crossing of the resonant current Ior in the positive direction and the rising edge of the drive voltage Vdrv at the node N1 may substantially match.

Figure 5:
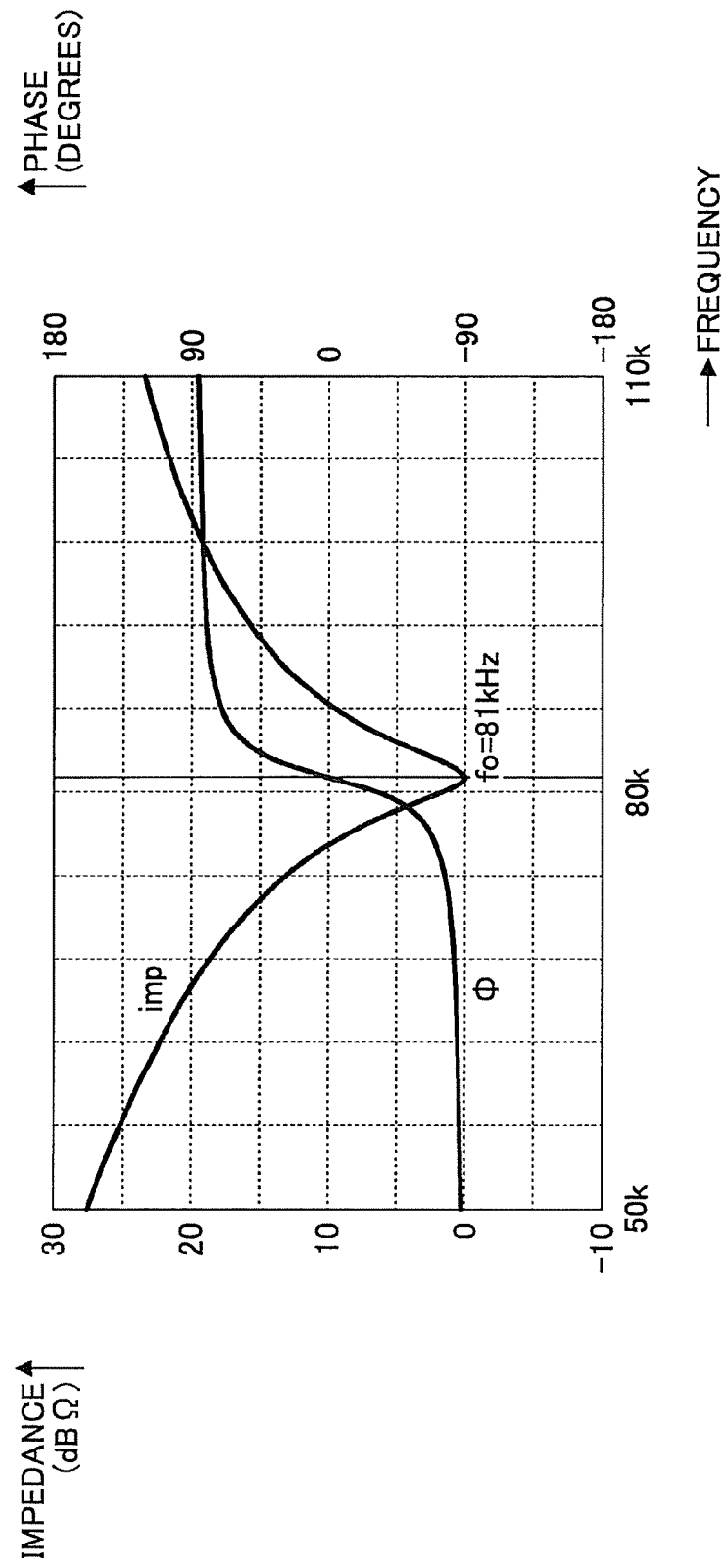
FIG. 5 is a diagram illustrating an impedance characteristic and a phase characteristic of the converter.

FIG. 5 is a diagram illustrating an impedance (Lr, Cr) characteristic imp and a phase characteristic Ø of the converter 1-1. In FIG. 5, the left ordinate indicates the impedance (dBΩ), the right ordinate indicates the phase (degrees), and the abscissa indicates the frequency (Hz). FIG. 5 illustrates that the power transmission efficiency becomes substantially maximum when the switching frequency fsw matches the resonant frequency f0, the phase error $\emptyset_{Vin2}-\emptyset_{Vin1}$ between the pulse inputs Vin1 and Vin2 is zero (0), and the impedance characteristic imp is substantially minimum. The phase lag of the resonant current Ior may occur when fsw>f0, and the phase advance (or lead) of the resonant current Ior may occur when fsw<f0. Hence, viewed in another way, it may be regarded that the PLL circuit 20 may be controlled to the locked state in order to make the phase error $\emptyset_{Vin2}-\emptyset_{Vin1}$ zero (0) between the pulse inputs Vin1 and Vin2.

Figure 6:
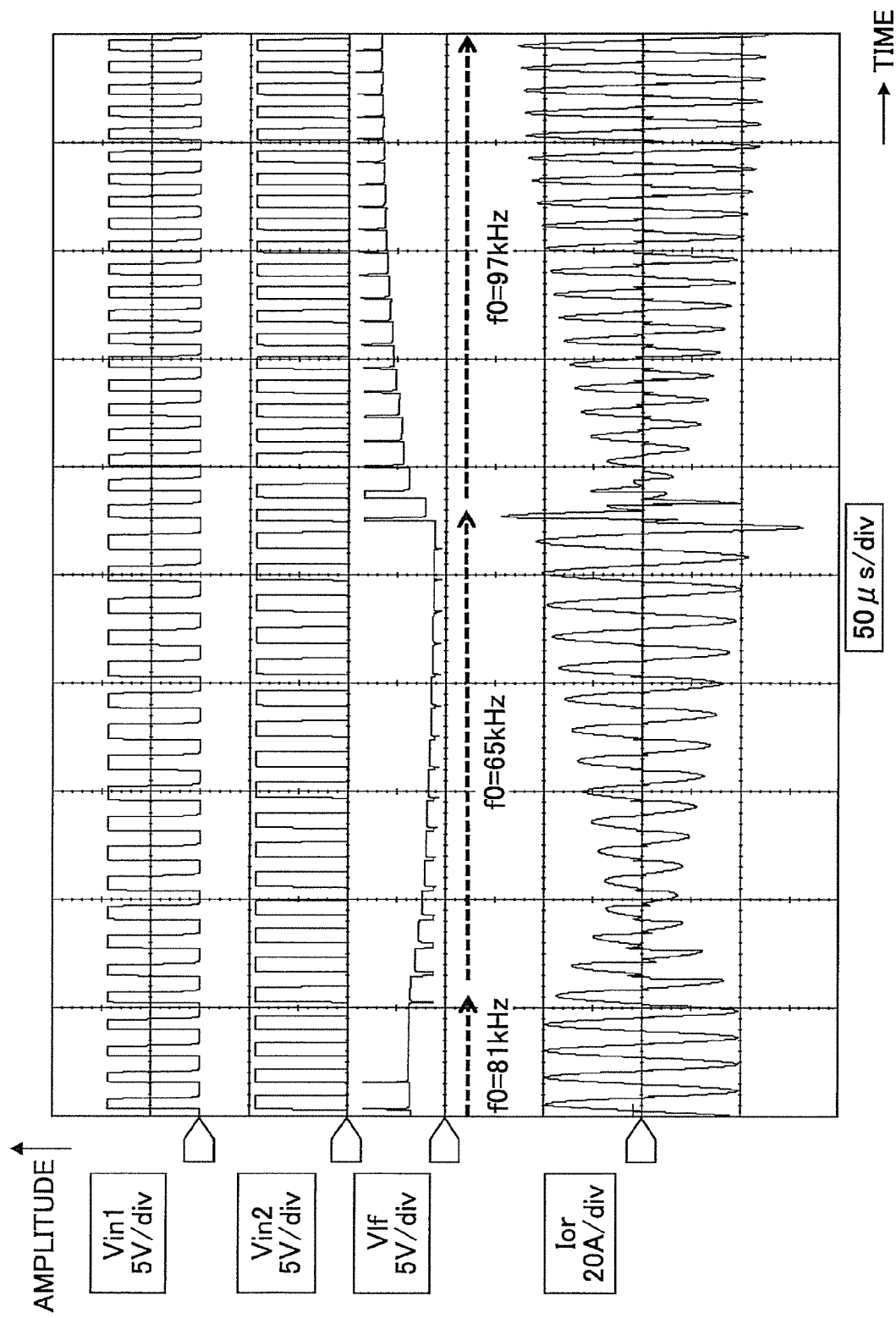
FIG. 6 is a diagram for explaining the operation of the PLL circuit when a resonant frequency is varied by plus or minus 20%.

FIG. 6 is a diagram for explaining the operation of the PLL circuit 20 when the resonant frequency f0 is varied by ±20%. In FIG. 6, the ordinate indicates the voltage or current amplitude, and the abscissa indicates the time. FIG. 6 illustrates the pulse inputs Vin1 and Vin2, the DC output Vlf of the loop filter circuit 202, and the resonant current Ior flowing from a node N2 towards the resonant coil Lr, with a tip of a pentagon-shape indicating a zero-level (or reference level) of each corresponding signal waveform. Such a representation of the zero-level (or reference level) of the signal waveform may be used in the drawings. The ordinate for the voltages Vin1, Vin2 and Vlf illustrates 5 V per division (5 V/div), and the ordinate for the resonant current Ior illustrates 20 A per vision (20 A/div). The abscissa in FIG. 6 illustrates 50 μsec per division (50 μs/div). In the example illustrated in FIG. 6, the resonant frequency f0 may be varied from 81 kHz→65 kHz→97 kHz by varying the inductance of the resonant coil Lr from 47 μH→68 μH→30 μH. It may be confirmed from FIG. 6 that the PLL circuit 20 may track even when the resonant frequency f0 varies sharply, as long as the pulse inputs Vin1 and Vin2 supplied to the PFD circuit 203 are maintained continuous.

Figure 7:
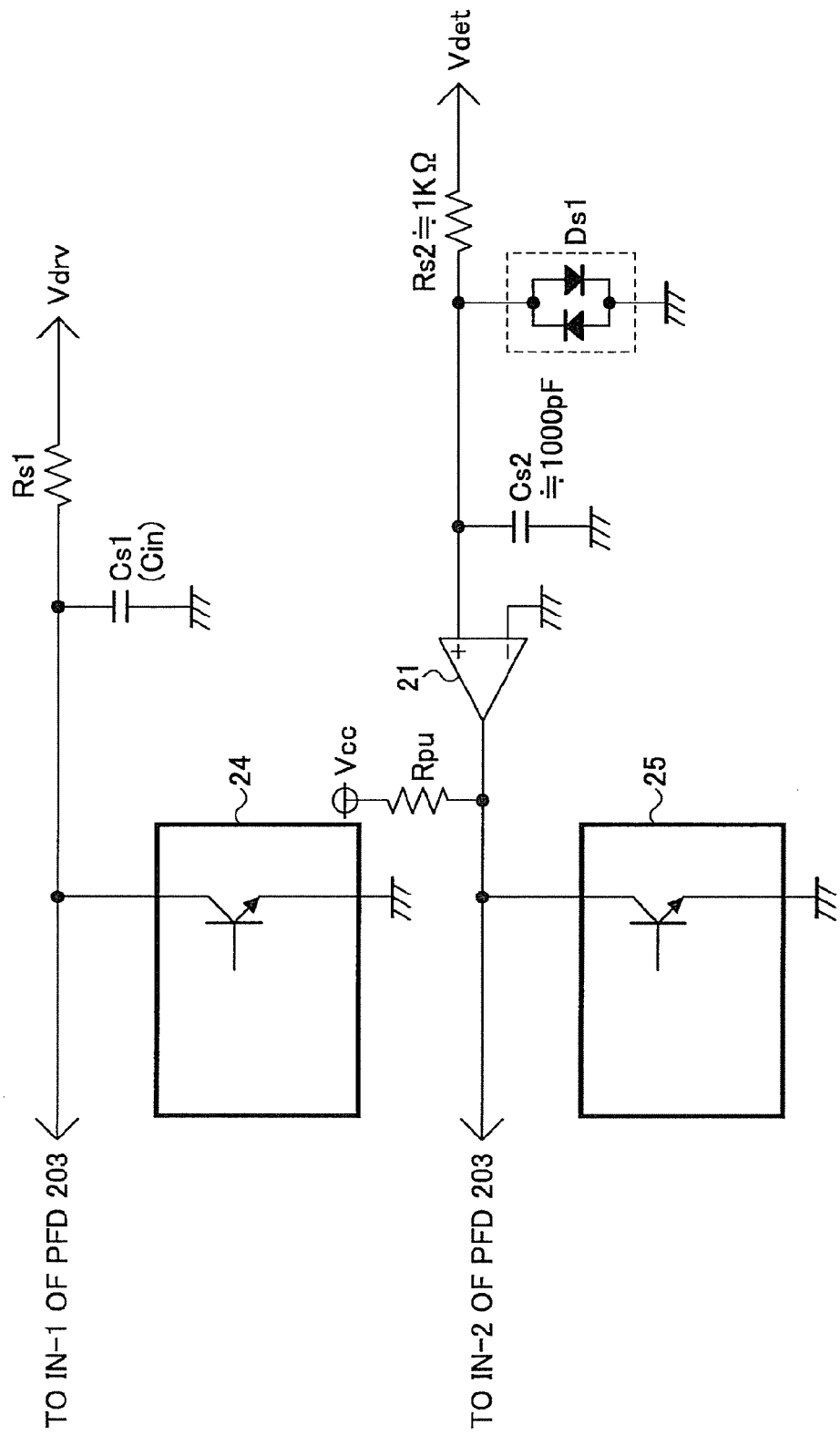
FIG. 7 is a circuit diagram for explaining examples of pulse inserting or deleting circuits.

FIG. 7 is a circuit diagram for explaining examples of the pulse inserting or deleting circuits 22 and 23. It is assumed for the sake of convenience that the comparator circuit 21 and the comparators 24 and 25 illustrated in FIG. 7 are formed by open-collector comparators, however, the comparator circuit 21 and the comparators 24 and 25 may be formed by open-drain comparators. In this example, the pulse inserting or deleting circuit 22 may be formed by a resistor Rs1, and the pulse inserting or deleting circuit 23 may be formed by a resistor Rpu.

In addition, in this example, a noise filter including a resistor Rs2 and a capacitor Cs2 may be coupled to the comparator circuit 21 as illustrated in FIG. 7 in order to give a hysteresis characteristic to the comparator circuit 21. For example, the resistance of the resistor Rs2 may be 1 kΩ, and the capacitance of the capacitor Cs2 may be 1000 pF. The noise filter may be utilized to prevent the comparator circuit 21 from responding to noise or distortion occurring about the zero-crossing time of the resonant current Ior. The hysteresis characteristic of the comparator circuit 21 may determine limits of the PLL operation when the load 31 is relatively small. When the PLL circuit 20 operates under the limits and the load 31 is relatively small, the switching frequency fsw may be controlled towards the minimum value by automatically setting the pulse input Vin1 to a low level, the pulse input Vin2 to a high level, and the DC output Vlf to the low level.

Moreover, in this example, a limiter Ds1 may be coupled to the comparator circuit 21 in order to prevent the comparator circuit 21 from saturating when a dynamic range of the detection voltage Vdet output from the current detection circuit 16 and input to the comparator circuit 21 is several mV to several V and relatively large.

Further, in this example, a noise filter including a resistor Rs1 and a capacitor Cs1 may be coupled to the node N1. The phase of the drive voltage Vdrv and the phase of the zero-crossing of the resonant current Ior may differ slightly in FIG. 2 due to the provision of the resistor Rs2 and the capacitor Cs2. However, such a slight difference in the phases of the drive voltage Vdrv and the zero-crossing of the resonant current Ior may be cancelled by adjusting the resistance and the capacitance of the resistor Rs1 and the capacitor Cs1, respectively.

FIG. 7 illustrates an example where the recovery pulse that is inserted is the zero-pulse (or low-level pulse). The coupling of the pulse inserting or deleting circuits 22 and 23 may be reversed in order to insert the high-level pulse as the recovery pulse. The recovery pulse inserting operation may be carried out when the DC output Vlf is in a range of about 0 V to about V1 or about V2 to about Vcc in FIG. 4, and the recovery pulse inserting operation may be inhibited in the range greater than V1 and less than V2 in which the PLL circuit 20 operates in the locked state. The drive voltage Vdrv may be proportional to a voltage Vor at the node N2, and the detection voltage Vdet may be proportional to the resonant current Ior.

Figure 8:
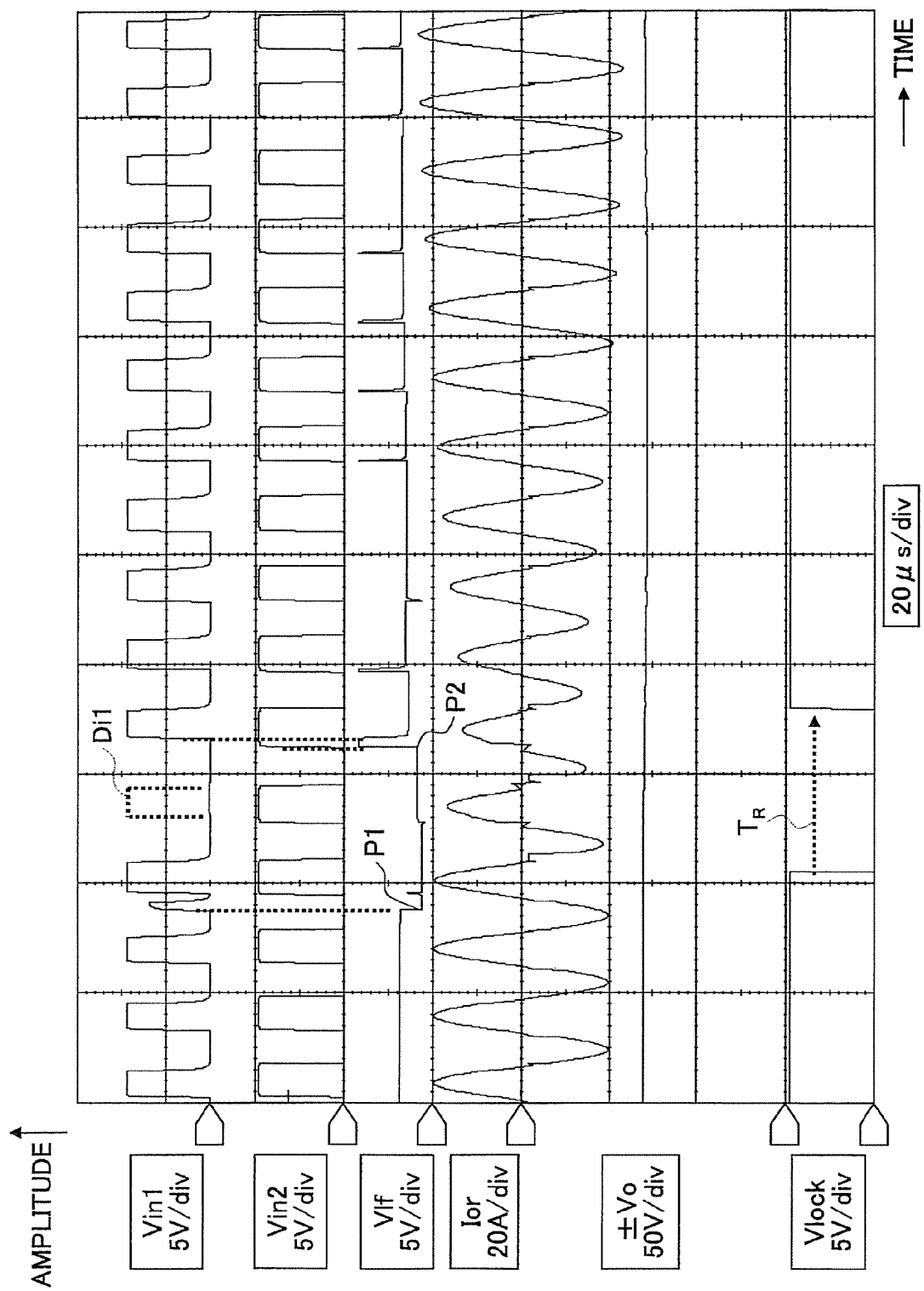
FIG. 8 is a diagram for explaining effects of the recovery for an example where the output power of the converter is 500 W.

FIG. 8 is a diagram for explaining effects of the recovery for an example where the output power of the converter 1-1 may be 500 W (±Vo=80 V, Load 31=12.8Ω), the inductance of the resonant coil Lr may be 47 µH, and the capacitance of the resonant capacitor Cr may be 0.082 µF. In FIG. 8, the ordinate indicates the voltage or current amplitude, and the abscissa indicates the time. FIG. 8 illustrates the pulse inputs Vin1 and Vin2, the DC output Vlf of the loop filter circuit 202, the resonant current Ior flowing from the node N2 towards the resonant coil Lr, the output DC voltage ±Vo of the converter 1-1, and the output Vlock of the lock detection circuit 204. The ordinate for the voltages Vin1, Vin2, Vlf, and Vlock illustrates 5 V per division (5 V/div), the ordinate for the output DC voltage ±Vo illustrates 50 V per division (50 V/div), and the ordinate for the resonant current Ior illustrates 20 A per vision (20 A/div). The abscissa in FIG. 8 illustrates 20 µsec per division (20 µs/div).

In FIG. 8, P1 indicates a time when the phase of the pulse input Vin1 is determined to be greatly advanced with respect to the phase of the pulse input Vin2, or the phase of the pulse input Vin2 is determined to be greatly delayed with respect to the phase of the pulse input Vin1, and the DC output Vlf sharply decreases. Di1 indicates a zero-pulse inserted with respect to the pulse input Vin1. P2 indicates a time when the DC output Vlf starts to recover to the original level in response to the rising edge of the pulse input Vin2.

When the switching frequency is 80 kHz, a recovery time $T_R$ of the PFD circuit 203 may be 30 µsec or less and a decrease in the output DC voltage ±Vo may be approximately 6% or less, when the capacitances of the secondary smoothing capacitors C1 and C2 are 100 µF. In a comparable conventional converter, the decrease in the output may be considerably less than 6% because the capacitances of the secondary smoothing capacitors C1 and C2 in the comparable conventional converter may be 1000 µF or higher.

Figure 9:
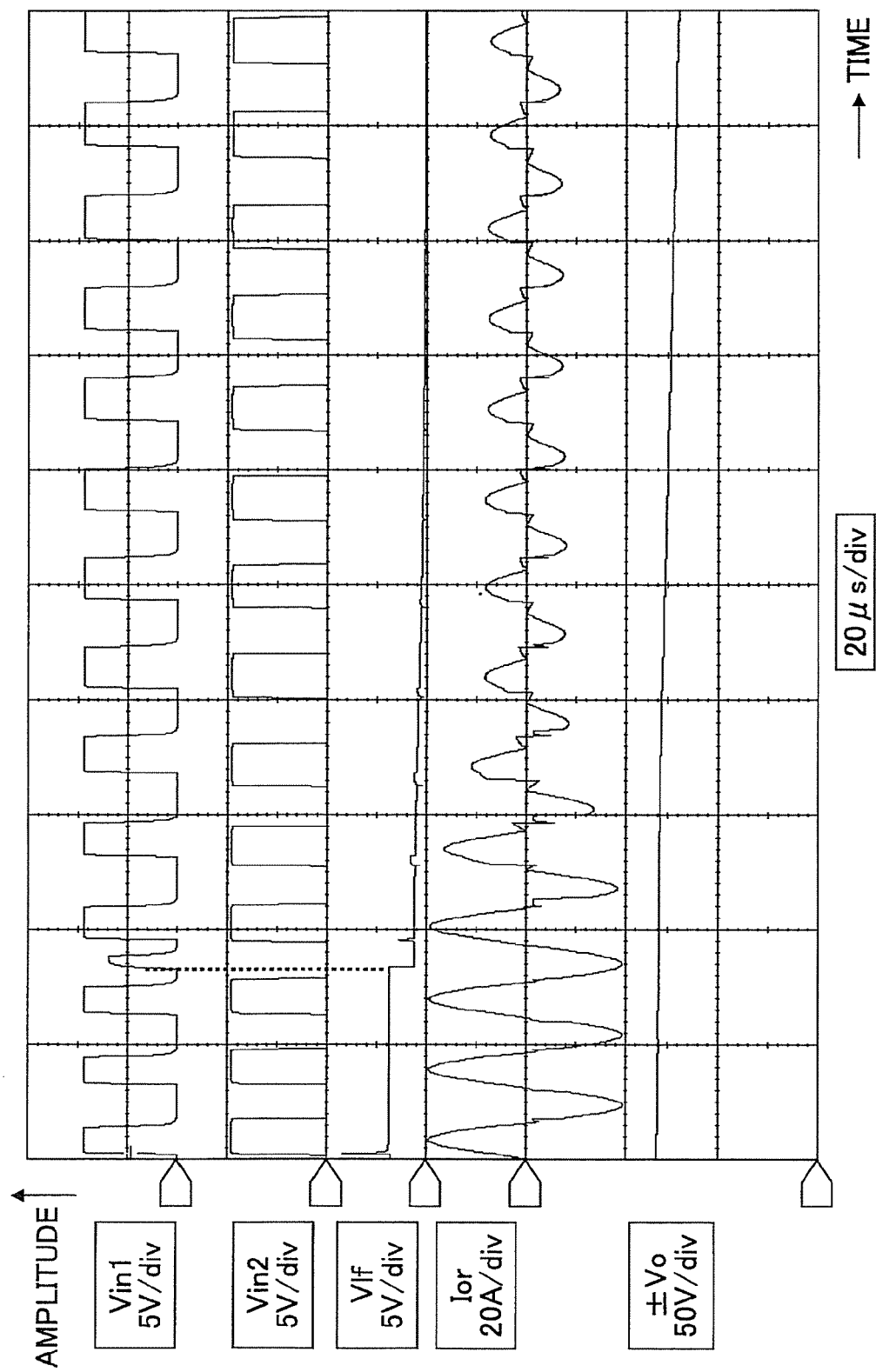
FIG. 9 is a diagram for explaining a comparison example of the converter.

FIG. 9 is a diagram for explaining a comparison example of the converter 1-1. It is assumed for the sake of convenience that the comparison example of the converter 1-1 operates under comparable operating conditions as in FIG. 8 but does not carry out the recovery (that is, the recovery function is inhibited). FIG. 9 illustrates the pulse inputs Vin1 and Vin2, the DC output Vlf of the loop filter circuit 202, the resonant current Ior flowing from the node L2 towards the resonant coil Lr, and the output DC voltage ±Vo of the comparison example of the converter 1-1 when no recovery is carried out. It may be seen from FIG. 9 that the DC output Vlf may remain at the decreased level because no recovery is carried out, and a considerable decrease may occur in the output DC voltage ±Vo of the comparison example of the converter 1-1.

Figure 10:
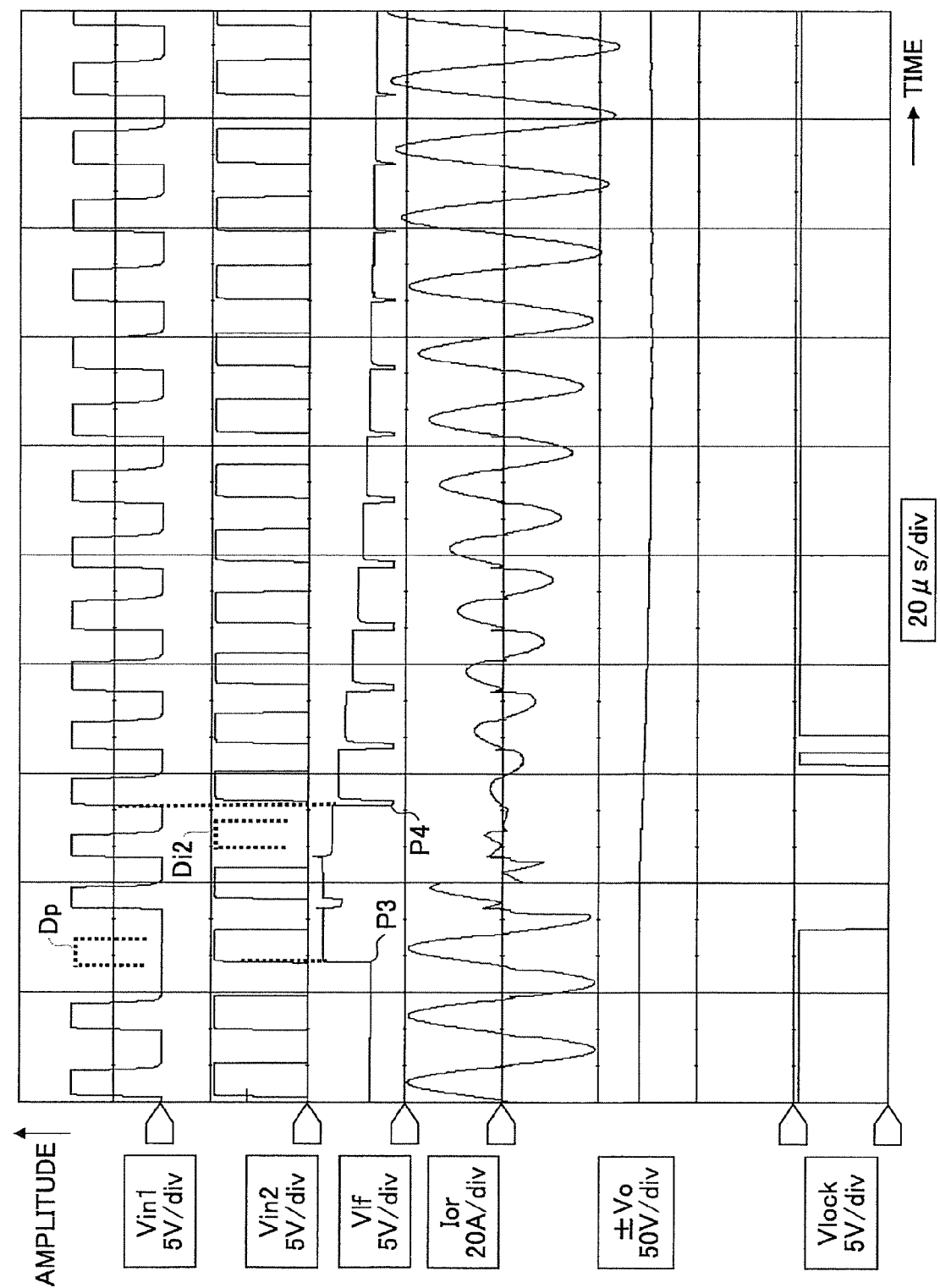
FIG. 10 is a diagram for explaining the recovery when a pulse of the pulse input drops out in the converter.

FIG. 10 is a diagram for explaining the recovery when a pulse of the pulse input Vin1 drops out in the converter 1-1. In FIG. 10, the same designations and comparable operating conditions are used as in FIG. 8.

In FIG. 10, Dp indicates a pulse of the pulse input Vin1 that has dropped out, and Di2 indicates a pulse that is inserted with respect to the pulse input Vin2. In addition, P3 indicates a time when the phase of the pulse input Vin2 is determined to be greatly advanced with respect to the phase the pulse input Vin1, or the phase of the pulse input Vin1 is determined to be greatly delayed with respect to the phase of the pulse input Vin2, and the DC output Vlf sharply increases. P4 indicates a time when the DC output Vlf starts to recover to the original level in response to the rising edge of the pulse input Vin1.

Figure 11:
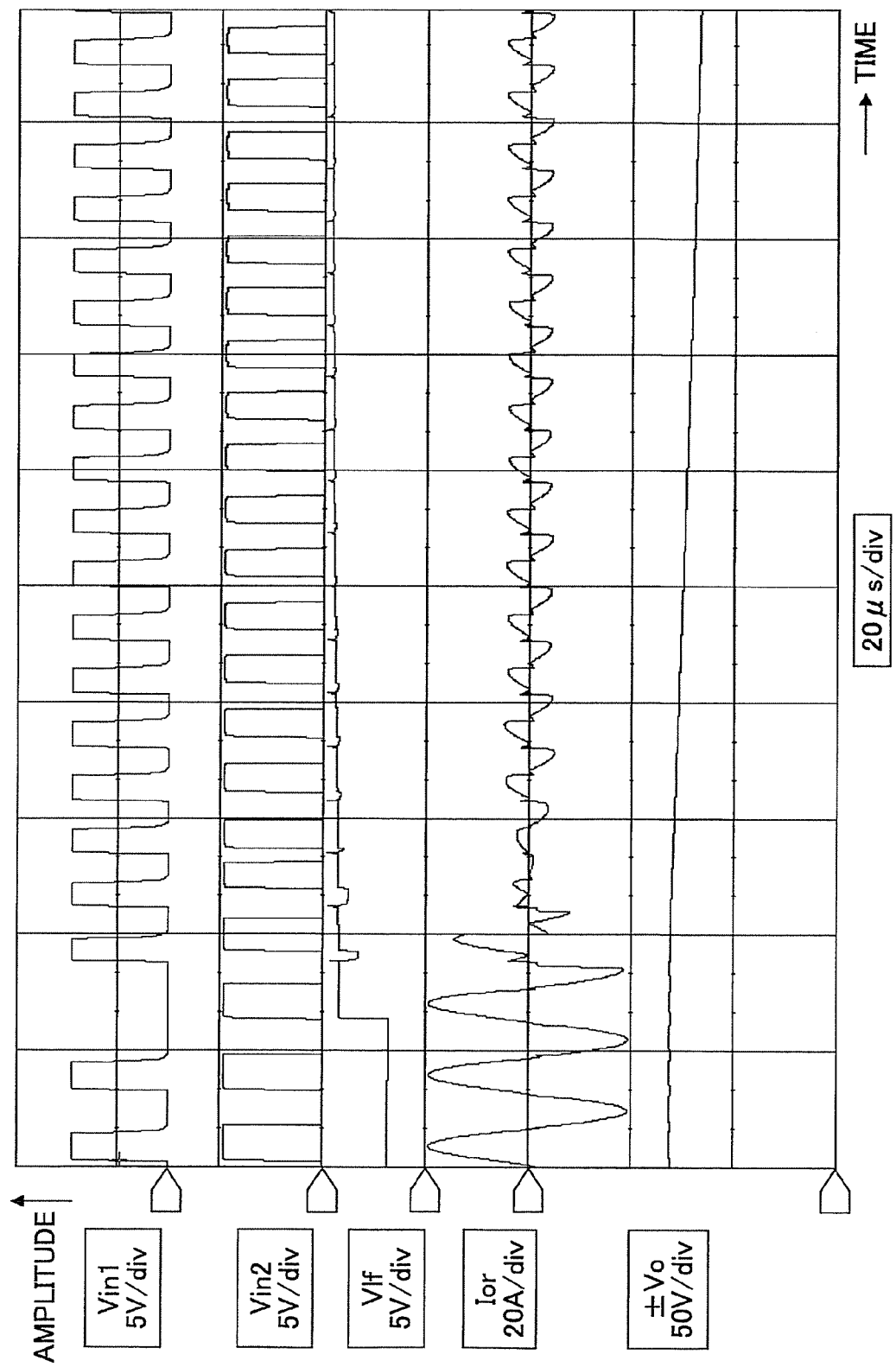
FIG. 11 is a diagram for explaining a comparison example of the converter.

FIG. 11 is a diagram for explaining a comparison example of the converter 1-1. It is assumed for the sake of convenience that the comparison example of the converter 1-1 operates under comparable operating conditions as in FIG. 10 but does not carry out the recovery. In FIG. 11, the same designations are used as in FIG. 9. It may be seen from FIG. 11 that the DC output Vlf may remain at the increased level because no recovery is carried out, and a considerable decrease may occur in the output DC voltage ±Vo of the comparison example of the converter 1-1.

Figure 12:
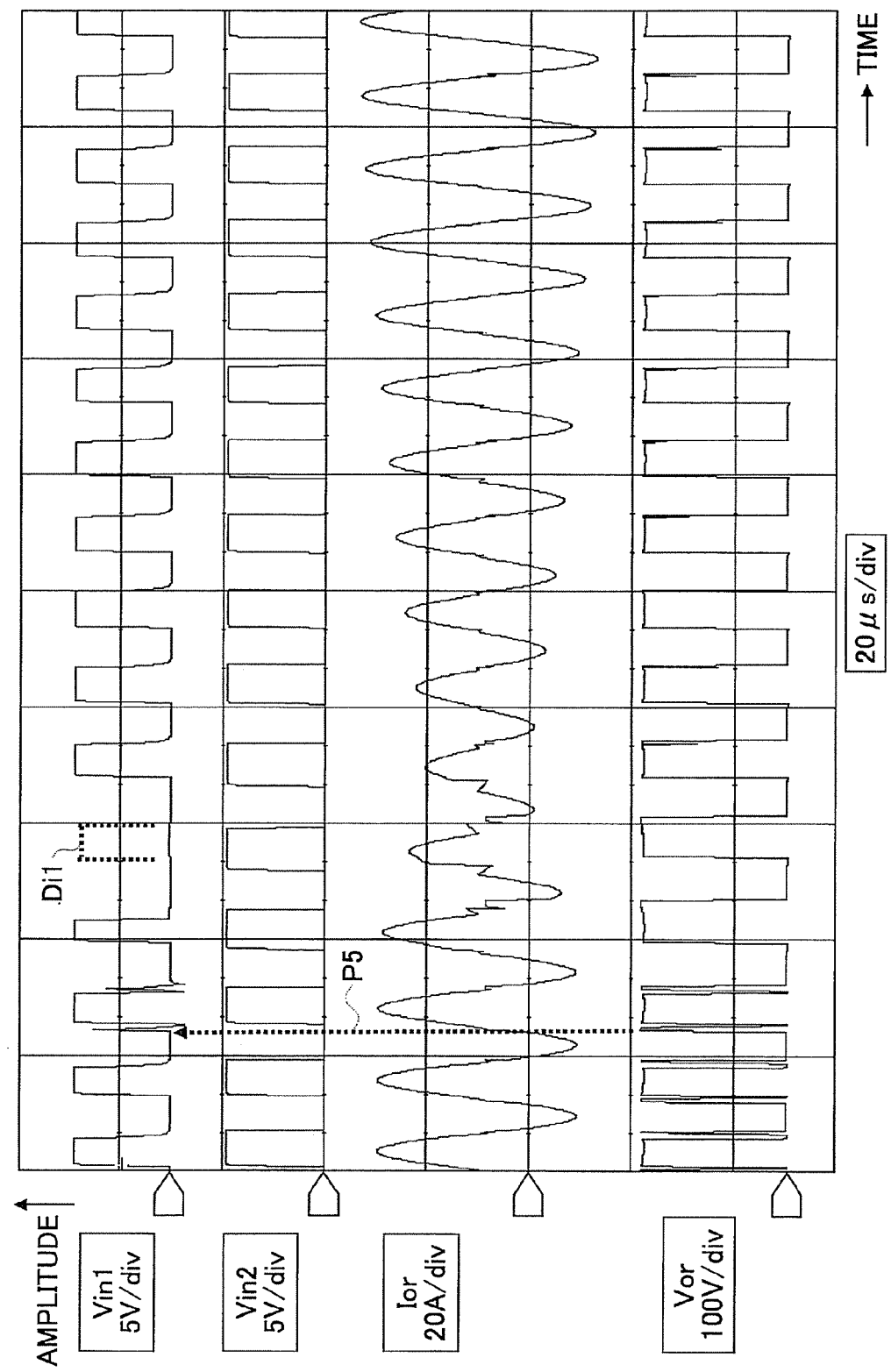
FIG. 12 is a diagram for explaining the recovery when noise mixes into the pulse input in the converter.

FIG. 12 is a diagram for explaining the recovery when noise mixes into the pulse input Vin1 in the converter 1-1. In FIG. 12, the ordinate indicates the voltage or current amplitude, and the abscissa indicates the time. FIG. 12 illustrates the pulse inputs Vin1 and Vin2, the resonant current Ior flowing from the node N2 towards the resonant coil Lr, and the voltage Vor at the node N2. The ordinate for the voltages Vin1 and Vin2 illustrates 5 V per division (5 V/div), the ordinate for the resonant current Ior illustrates 20 A per vision (20 A/div), and the ordinate for the voltage Vor illustrates 100 V per division (100 V/div). The abscissa in FIG. 12 illustrates 20 µsec per division (20 µs/div).

The operating conditions for FIG. 12 are substantially the same as those for FIGS. 8 and 10. However, in FIG. 12, mixing of noise may be simulated by instantaneously connecting a coupling capacitor Cf (not illustrated) between the node N2 and the output of the pulse inserting or deleting circuit 22 in FIG. 1. For example, the capacitance of the coupling capacitor Cf may be 10 pF. The coupling capacitor Cf may be instantaneously connected and not permanently connected in order to simulate non-repeatable (or non-reproducible) noise or distortion.

In FIG. 12, P5 indicates spike noise added to the pulse input Vin1 due to the instantaneous connection of the coupling capacitor Cf, and Di1 indicates a zero-pulse inserted with respect to the pulse input Vin1. It may be seen from FIG. 12 that the resonant current Ior may quickly recover after the insertion of the zero-pulse as indicated by Di1.

Figure 13:
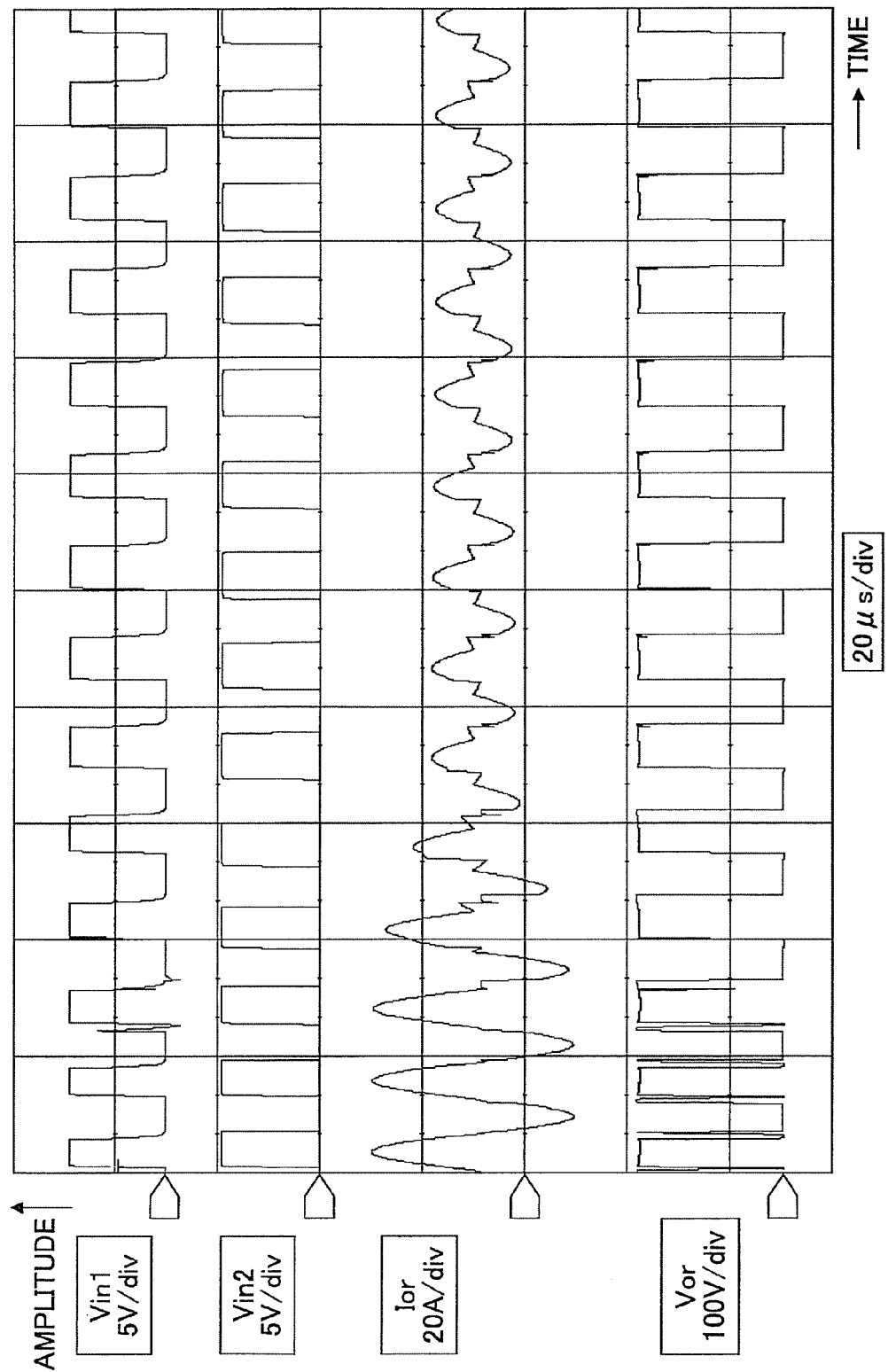
FIG. 13 is a diagram for explaining a comparison example of the converter.

FIG. 13 is a diagram for explaining a comparison example of the converter 1-1. It is assumed for the sake of convenience that the comparison example of the converter 1-1 operates under comparable operating conditions as in FIG. 12 but does not carry out the recovery. In FIG. 13, the same designations are used as in FIG. 12. It may be seen from FIG. 13 that after the spike noise is added to the pulse input Vin1 due to the instantaneous connection of the coupling capacitor Cf, the resonant current Ior may not recover to its original level.

Figure 14:
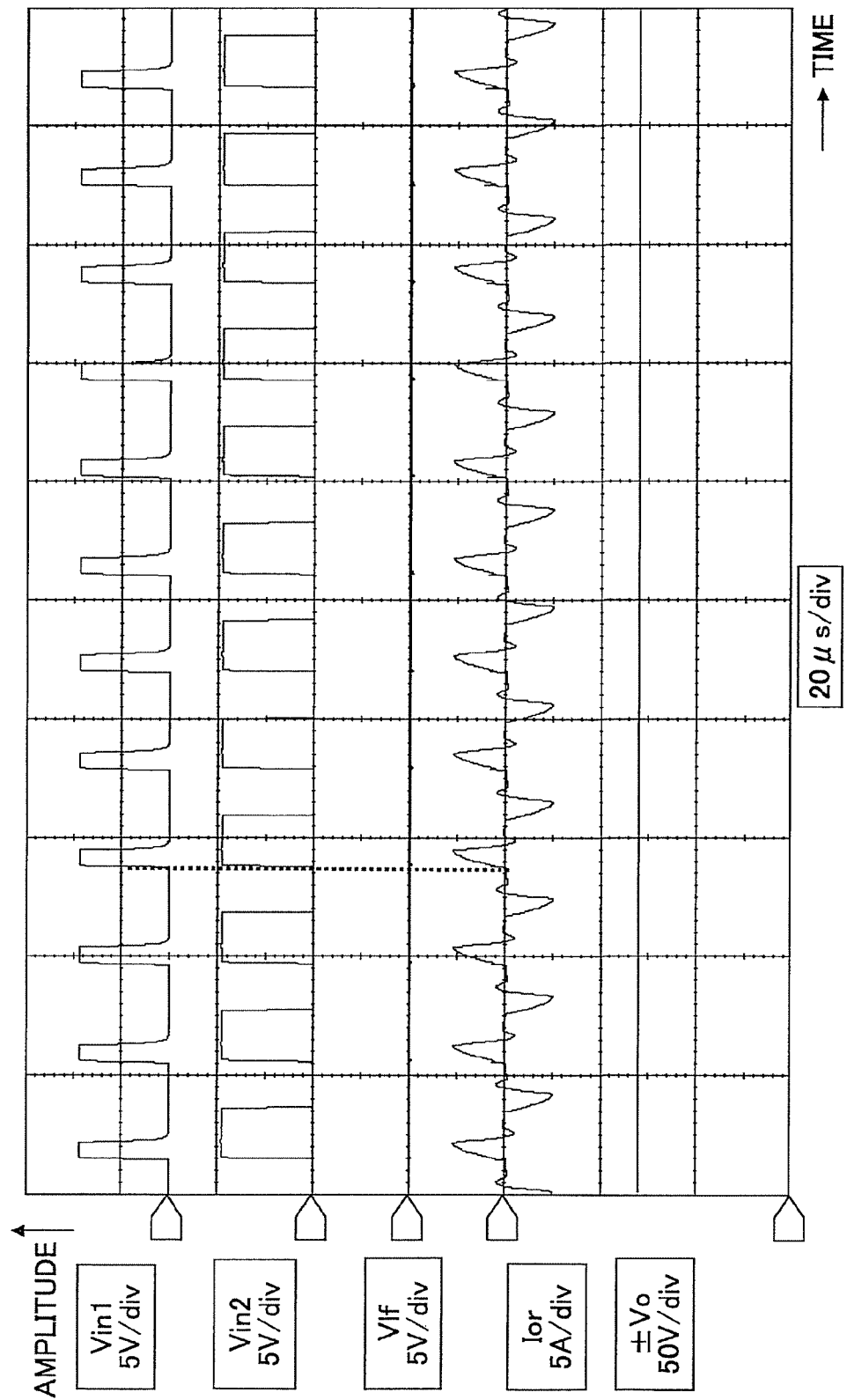
FIG. 14 is a diagram for explaining the operation of the converter in a light-load state and an output power of 25 W.

FIG. 14 is a diagram for explaining the operation of the converter 1-1 in a light-load state and the PLL circuit 20 is in a locked state in a vicinity of a minimum value of the switching frequency fsw, for a case where the output power of the converter 1-1 may be 25 W, the inductance of the resonant coil Lr may be 20 µH, and the capacitance of the resonant capacitor Cr may be 10 µF. In FIG. 14, the ordinate indicates the voltage or current amplitude, and the abscissa indicates the time. FIG. 14 illustrates the pulse inputs Vin1 and Vin2, the DC output Vlf of the loop filter circuit 202, the resonant current Ior flowing from the node N2 towards the resonant coil Lr, and the output DC voltage ±Vo of the converter 1-1. The ordinate for the voltages Vin1, Vin2, and Vlf illustrates 5 V per division (5 V/div), the ordinate for the resonant current for illustrates 5 A per vision (5 A/div), and the ordinate for the output DC voltage ±Vo illustrates 50 V per division (50 V/div). The abscissa in FIG. 14 illustrates 20 μsec per division (20 μs/div).

Figure 15:
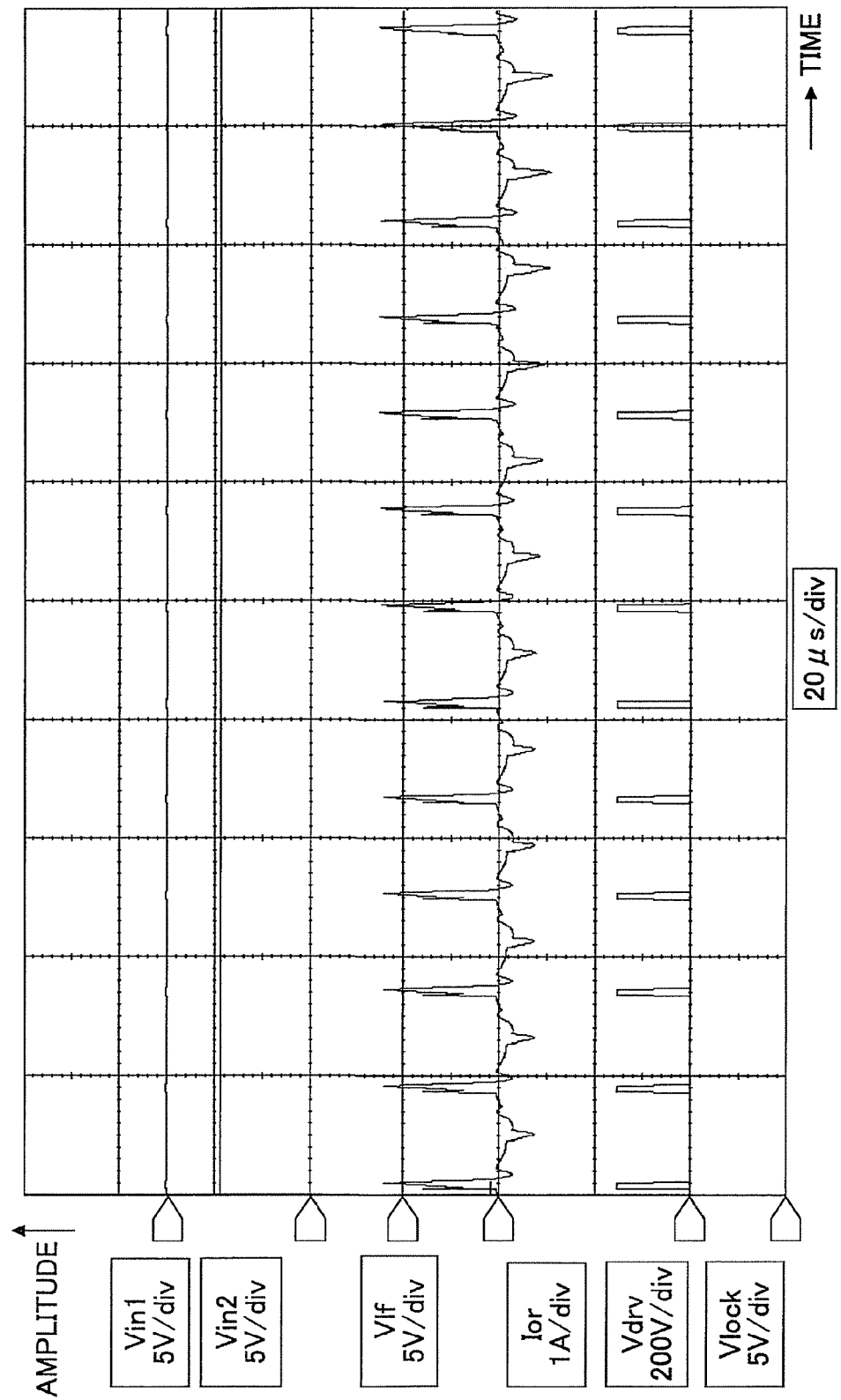
FIG. 15 is a diagram for explaining the operation of the converter in a light-load state and an output power of 5 W.

FIG. 15 is a diagram for explaining the operation of the converter 1-1 in a light-load state and the PLL circuit 20 is in a locked state in a vicinity of a minimum value of the switching frequency fsw, for a case where the output power of the converter 1-1 may be 5 W, the inductance of the resonant coil Lr may be 25 μH, and the capacitance of the resonant capacitor Cr may be 10 μF. In FIG. 15, the ordinate indicates the voltage or current amplitude, and the abscissa indicates the time. FIG. 15 illustrates the pulse inputs Vin1 and Vin2, the DC output Vlf of the loop filter circuit 202, the resonant current Ior flowing from the node N2 towards the resonant coil Lr, the drive voltage Vdrv, and the output Vlock of the lock detection circuit 204. The ordinate for the voltages Vin1, Vin2, Vlf, and Vlock illustrates 5 V per division (5 V/div), the ordinate for the resonant current Ior illustrates 5 A per division (5 A/div), and the ordinate for the drive voltage Vdrv illustrates 200 V per division (200 V/div). The abscissa in FIG. 15 illustrates 20 μsec per division (20 μs/div). The drive voltage Vdrv is illustrated because the pulse input Vin1 maintains the low level in this example and the drive voltage Vdrv has a waveform analogous to and a phase similar to those of the pulse input Vin1 prior to being maintained at the low level. For the sake of convenience, a gate voltage of the switching element Q1 may be regarded as the drive voltage Vdrv.

Figure 16:
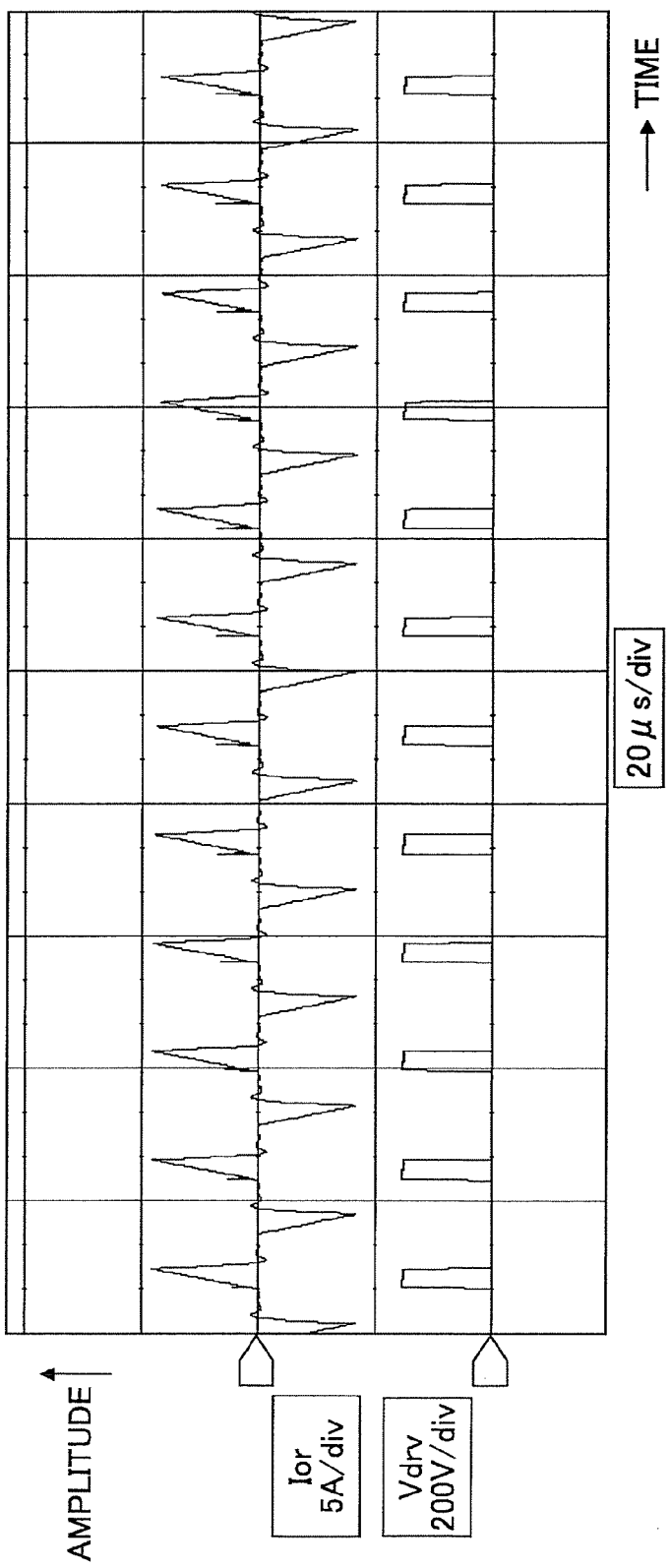
FIG. 16 is a diagram for explaining the operation of a comparison example of the converter in the light-load state, under comparable conditions as in FIG. 14, but with the recovery function inhibited.

FIG. 16 is a diagram for explaining the operation of a comparison example of the converter 1-1 in the light-load state, under comparable conditions as in FIG. 14, but with the recovery function inhibited. In FIG. 16, the same designations are used as in FIG. 14. For the sake of convenience, FIG. 16 illustrates the resonant current Ior and the drive voltage Vdrv. The ordinate for the drive voltage Vdrv illustrates 200 V per division (50 V/div).

Figure 17:
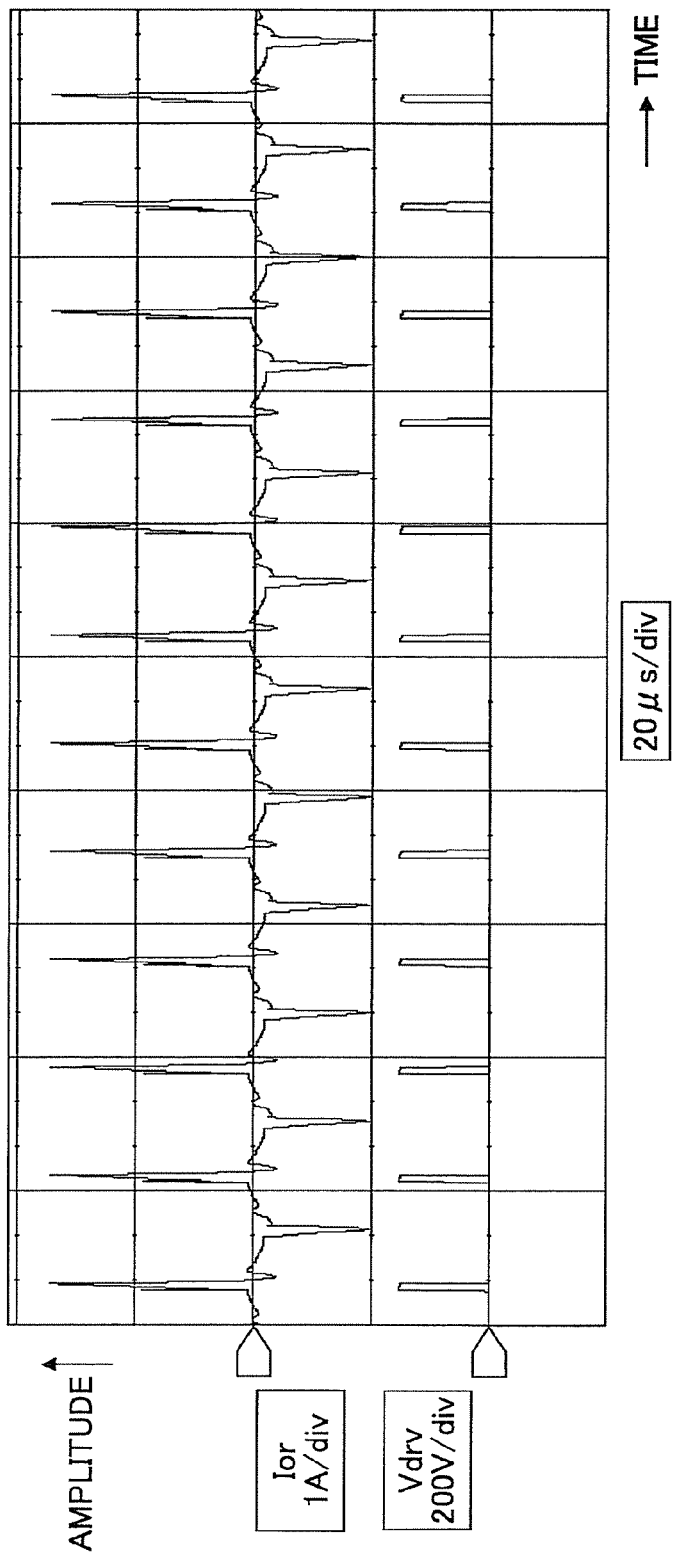
FIG. 17 is a diagram for explaining the operation of a comparison example of the converter in the light-load state, under comparable conditions as in FIG. 15, but with the recovery function inhibited.

FIG. 17 is a diagram for explaining the operation of a comparison example of the converter 1-1 in the light-load state, under comparable conditions as in FIG. 15, but with the recovery function inhibited. In FIG. 17, the same designations are used as in FIG. 15. For the sake of convenience, FIG. 17 illustrates the resonant current Ior and the drive voltage Vdrv. The ordinate for the drive voltage Vdrv illustrates 200 V per division (50 V/div).

As may be seen from a comparison of FIGS. 14 and 16, and a comparison of FIGS. 15 and 17, the peak value of the resonant current Ior may be lower and the noise may be lower in FIGS. 14 and 15 using the recovery function as compared to those in FIGS. 15 and 17 not using the recovery function.

In addition, for examples where the output power of the converter 1-1 becomes approximately 5 W or lower and the comparator circuit 21 may stop operating due to the hysteresis characteristic thereof, the pulse input Vin2 may be adjusted to the high level, the output Vlock may be adjusted to the low level, and the DC output Vlf may fall to the reference voltage V1 or less, as illustrated in FIG. 15. As a result, the pulse inserting or deleting circuit 23 may adjust the pulse input Vin1 to the low level in response to the output of the comparator 24. In other words, the PLL operation may be forcibly stopped, and the switching frequency fsw may be adjusted to the minimum value in order to reduce the switching loss. Hence, the output of the converter 1-1 is sufficiently controlled even under the light-load state where the output may be $\frac{1}{100}$ the maximum output.

Figure 18:
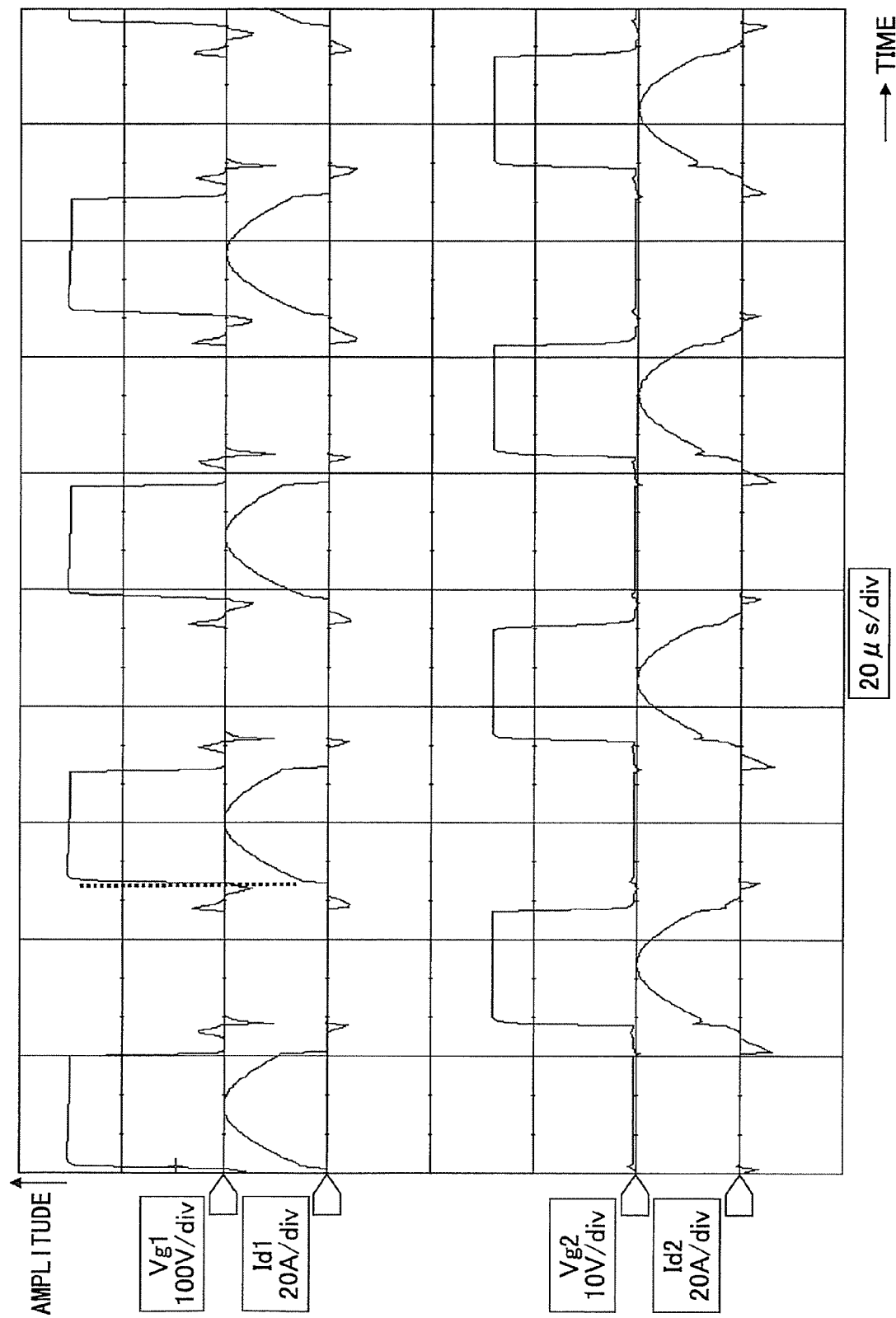
FIG. 18 is a diagram for explaining the resonant operation of the converter in a heavy-load state, an output power of 500 W, and an AC voltage of 100 V.

FIG. 18 is a diagram for explaining the resonant operation of the converter 1-1 in a heavy-load state and the PLL circuit 20 is in a locked state for a case where the output power of the converter 1-1 may be 500 W, the inductance of the resonant coil Lr may be 47 μH, and the capacitance of the resonant capacitor Cr may be 0.082 μF. For example, the AC power supply may supply the AC voltage $AC_{IN}$ of 100 V/50 Hz, and voltage Vdc may be 140 V. In FIG. 18, the ordinate indicates the voltage or current amplitude, and the abscissa indicates the time. FIG. 18 illustrates a gate voltage Vg1 of the switching element Q1, a drain current Id1 of the switching element Q1, a gate voltage Vg2 of the switching element Q2, and a drain current Id2 of the switching element Q2. The ordinate for the gate voltage Vg1 illustrates 100 V per division (100 V/div), the ordinate for the drain currents Id1 and Id2 illustrates 20 A per division (20 A/div), and the ordinate for the gate voltage Vg2 illustrates 10 V per division (10 V/div). The abscissa in FIG. 18 illustrates 20 μsec per division (20 μs/div).

The gate voltages Vg1 and Vg2 are illustrated in FIG. 18 in place of drain-source voltages of the switching elements Q1 and Q2, because the drain-source voltages have a more complex waveform including noise and the gate voltages Vg1 and Vg2 have waveforms analogous to those of the drain-source voltages of the switching elements Q1 and Q2. The resonant current Ior may be represented by Id1-Id2.

Figure 19:
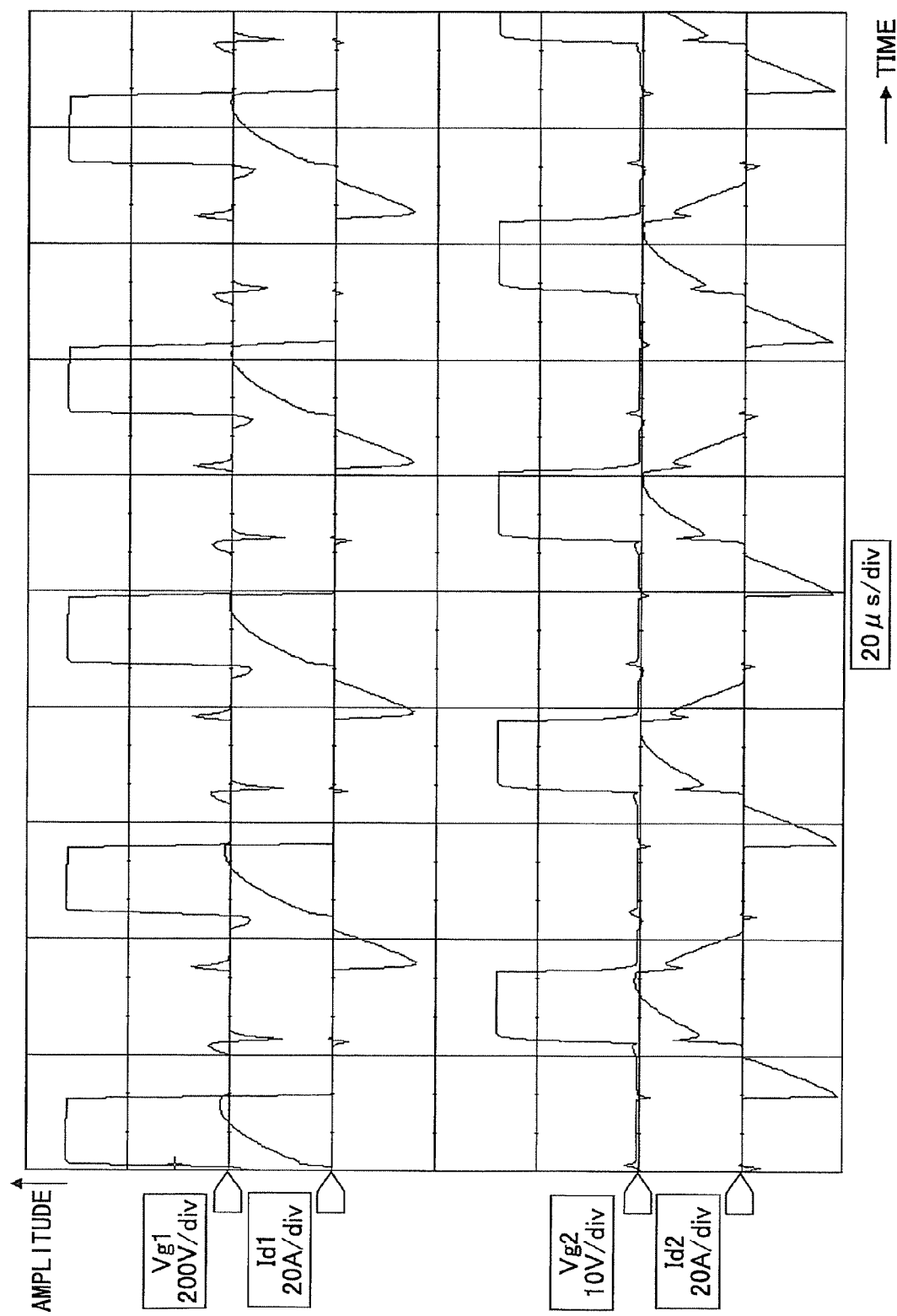
FIG. 19 is a diagram for explaining the resonant operation of the converter in the heavy-load state, the output power of 500 W, and an AC voltage of 220 V.

FIG. 19 is a diagram for explaining the resonant operation of the converter 1-1 in a heavy-load state and the PLL circuit 20 is in a locked state for a case where the output power of the converter 1-1 may be 500 W, the inductance of the resonant coil Lr may be 47 μH, and the capacitance of the resonant capacitor Cr may be 0.082 μF. For example, the AC power supply may supply the AC voltage $AC_{IN}$ of 220 V/50 Hz, and voltage Vdc may be 310 V. In FIG. 19, the same designations are used as in FIG. 18.

Figure 20:
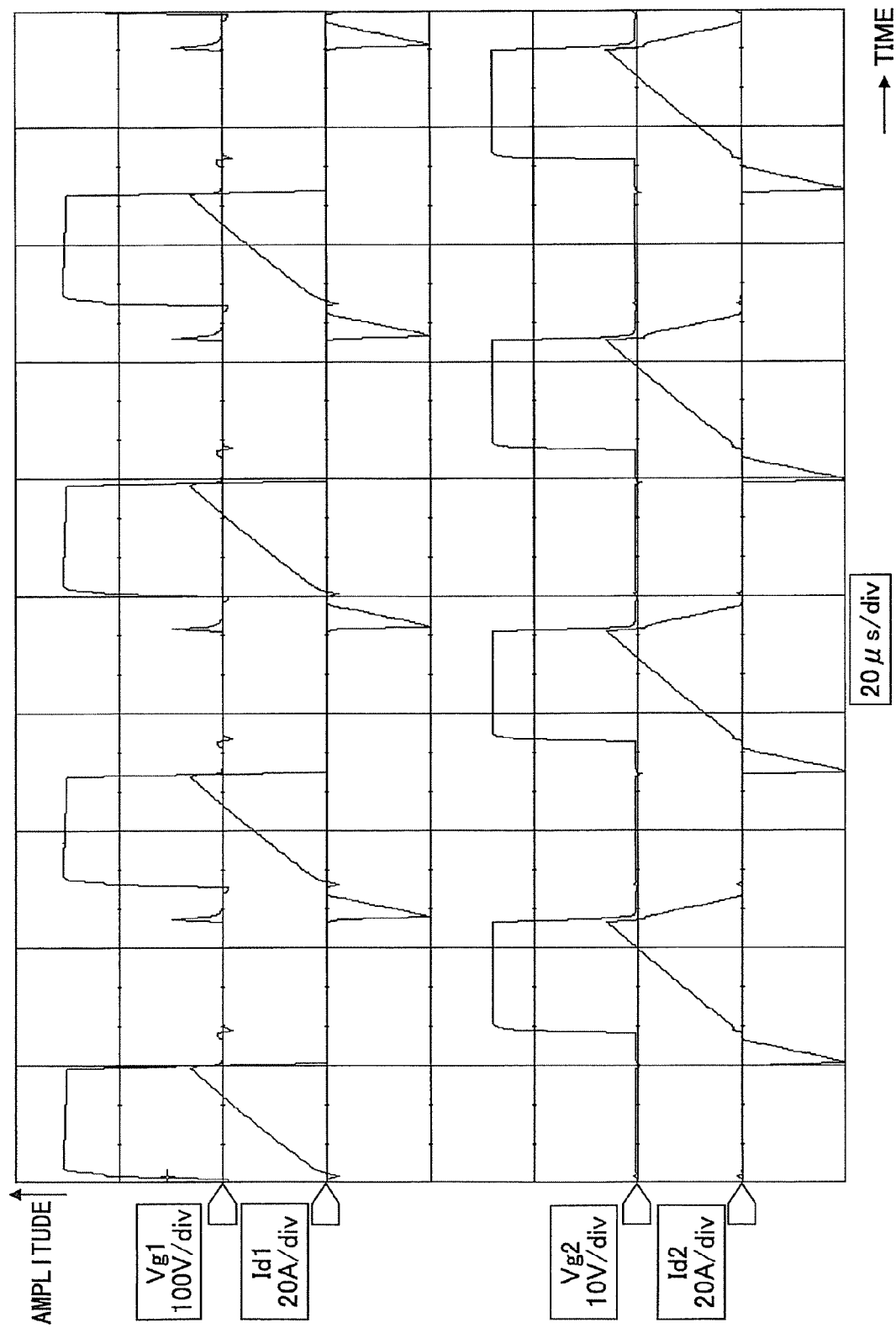
FIG. 20 is a diagram for explaining the non-resonant operation of the converter in the heavy-load state, under the similar conditions as in FIG. 18.

FIG. 20 is a diagram for explaining the non-resonant operation of the converter 1-1 in a heavy-load state, under similar conditions as in FIG. 18, but wherein the inductance of the resonant coil Lr may be 5 μH, and the capacitance of the resonant capacitor Cr may be 100 μF.

Figure 21:
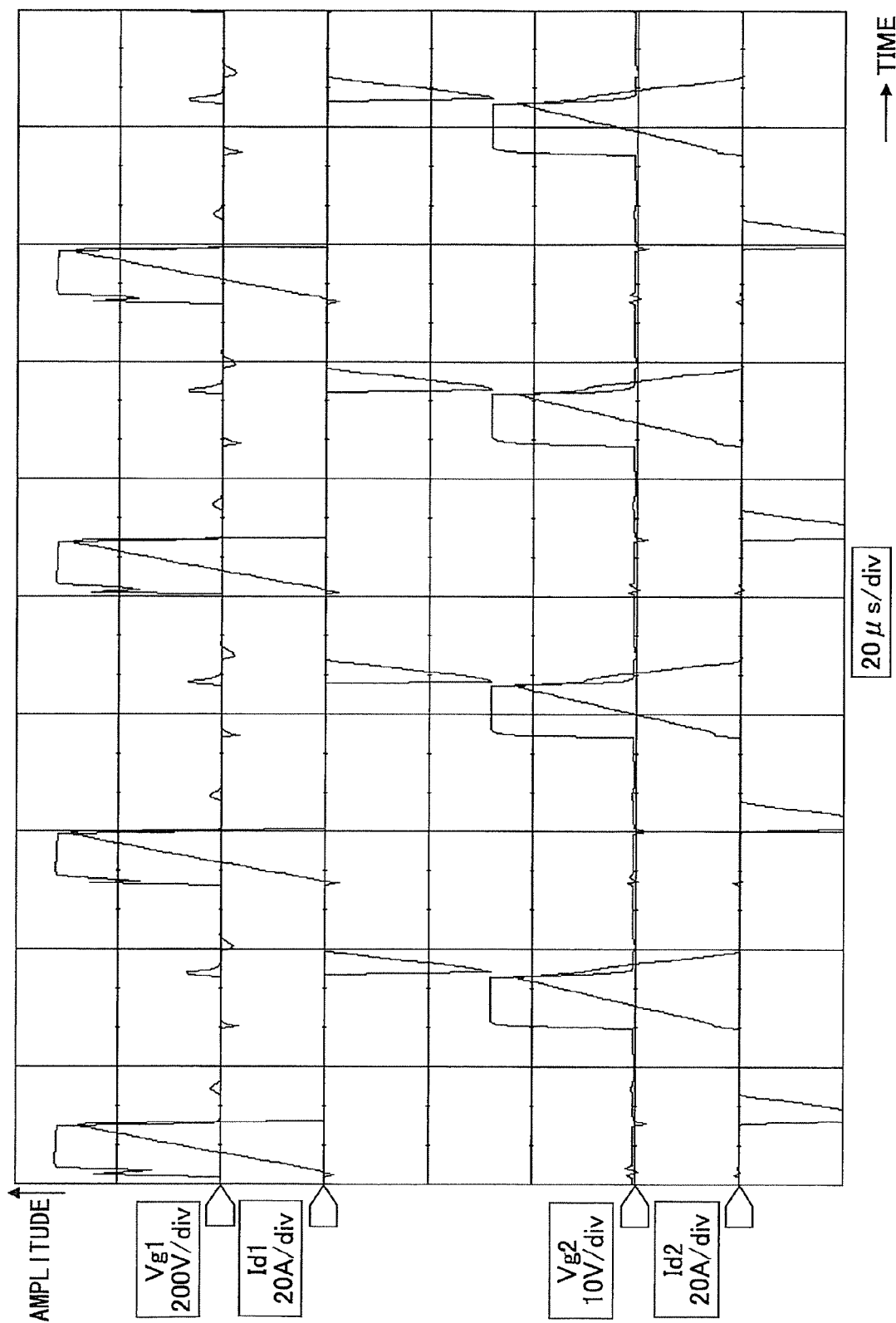
FIG. 21 is a diagram for explaining the non-resonant operation of the converter in the heavy-load state, under the similar conditions as in FIG. 19.

FIG. 21 is a diagram for explaining the non-resonant operation of the converter 1-1 in a heavy-load state, under similar conditions as in FIG. 19, but wherein the inductance of the resonant coil Lr may be 5 μH, and the capacitance of the resonant capacitor Cr may be 100 μF.

As may be seen from a comparison of FIGS. 18 and 20, and a comparison of FIGS. 19 and 21, the peak value of the drain currents Id1 and Id2 may be lower and the noise may be lower in FIGS. 18 and 19 for the resonant operation as compared to those in FIGS. 20 and 21 for the non-resonant operation. The smaller the duty ratio and the higher the peak value, the effective value of each of the drain currents Id1 and Id2 may become larger to increase the power loss. It may be seen that the power loss in FIGS. 18 and 19 may be low compared to the power loss in FIGS. 20 and 21. In addition, the switching loss in FIGS. 18 and 19 may be small compared to that of FIGS. 20 and 21.

The switching loss in FIG. 19 may be slightly higher than that in FIG. 18, however, the peak value of the drain currents Id1 and Id2 are maintained approximately constant. Thus, there may be no sharp increase in the switching loss and the noise in FIG. 19, as is the case in FIG. 18. On the other hand, the switching loss in FIG. 21 may be considerably high because the peak of the drain currents Id1 and Id2 may reach 50 A. The considerably high switching loss in FIG. 21 may make it difficult to appropriately select suitable switching elements Q1 and Q2 and transformer circuit 13.

The resonant frequency f0 may be increased from 80 kHz to 95 kHz, for example, in order to reduce unwanted overlap between the gate voltage waveform (Vg1 and Vg2) and the drain current waveform (Id1 and Id2). However, it may be difficult to optimize the operating conditions of the converter 1-1 depending on the load 31 which may vary.

Figure 22:
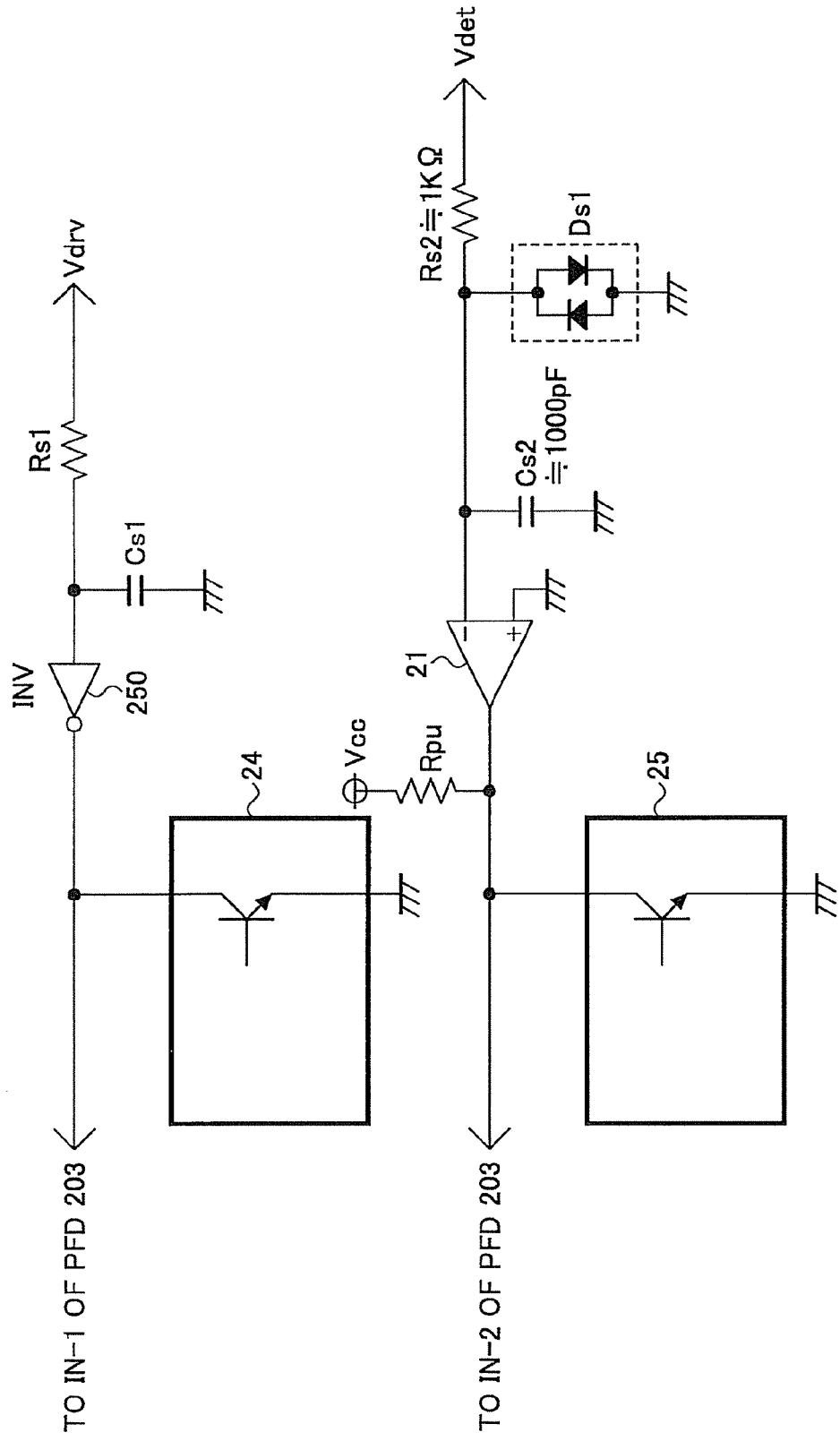
FIG. 22 is a circuit diagram for explaining other examples of pulse inserting or deleting circuits.

FIG. 22 is a circuit diagram for explaining other examples of pulse inserting or deleting circuits 22 and 23. In FIG. 22, those parts that are the same as those corresponding parts in FIG. 7 are designated by the same reference numerals, and a description thereof will be omitted.

In FIG. 22, an inverter circuit 250 may be provided between the comparator 24 and a node coupling the resistor Rs1 and the capacitor Cs1. In addition, the coupling of the inverting and non-inverting input terminals of the comparator circuit 21 may be reversed from that of FIG. 7. In other words, in FIG. 22, a node coupling the resistor Rs2, the capacitor Cs2 and the limiter Ds1 may be coupled to the inverting input terminal of the comparator circuit 21. On the other hand, the non-inverting input terminal of the comparator circuit 21, illustrated in FIG. 22 may be grounded.

According to FIG. 22, the PLL operation may be carried out to lock the PLL circuit 20 in response to a falling edge of the drive voltage Vdrv and the zero-crossing of the resonant current Ior in the negative direction.

Figure 23:
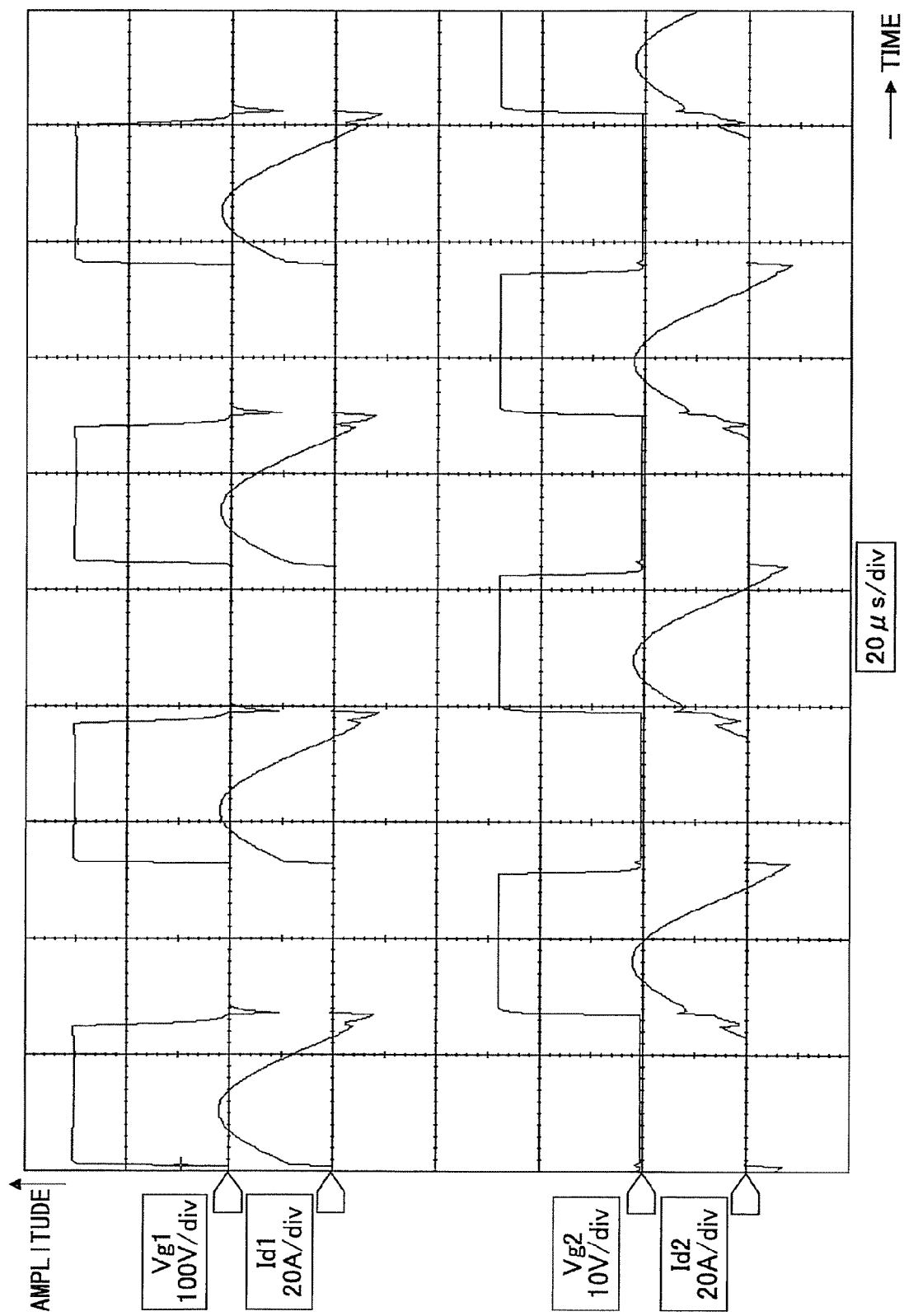
FIG. 23 is a diagram for explaining the operation of the converter in the heavy-load state under the same operating conditions as in FIG. 18 but using the pulse inserting or deleting circuits illustrated in FIG. 22.

FIG. 23 is a diagram for explaining the operation of the converter 1-1 in the heavy-load state under substantially the same operating conditions as in FIG. 18 except that the pulse inserting or deleting circuits 22 and 23 illustrated in FIG. 22 are used in place of the pulse inserting or deleting circuits 22 and 23 illustrated in FIG. 7. In FIG. 23, the same designations are used as in FIG. 18. It may be seen from. FIG. 23 that low power loss and low switching loss may be achieved, in a similar to the case illustrated in FIG. 18.

Figure 24:
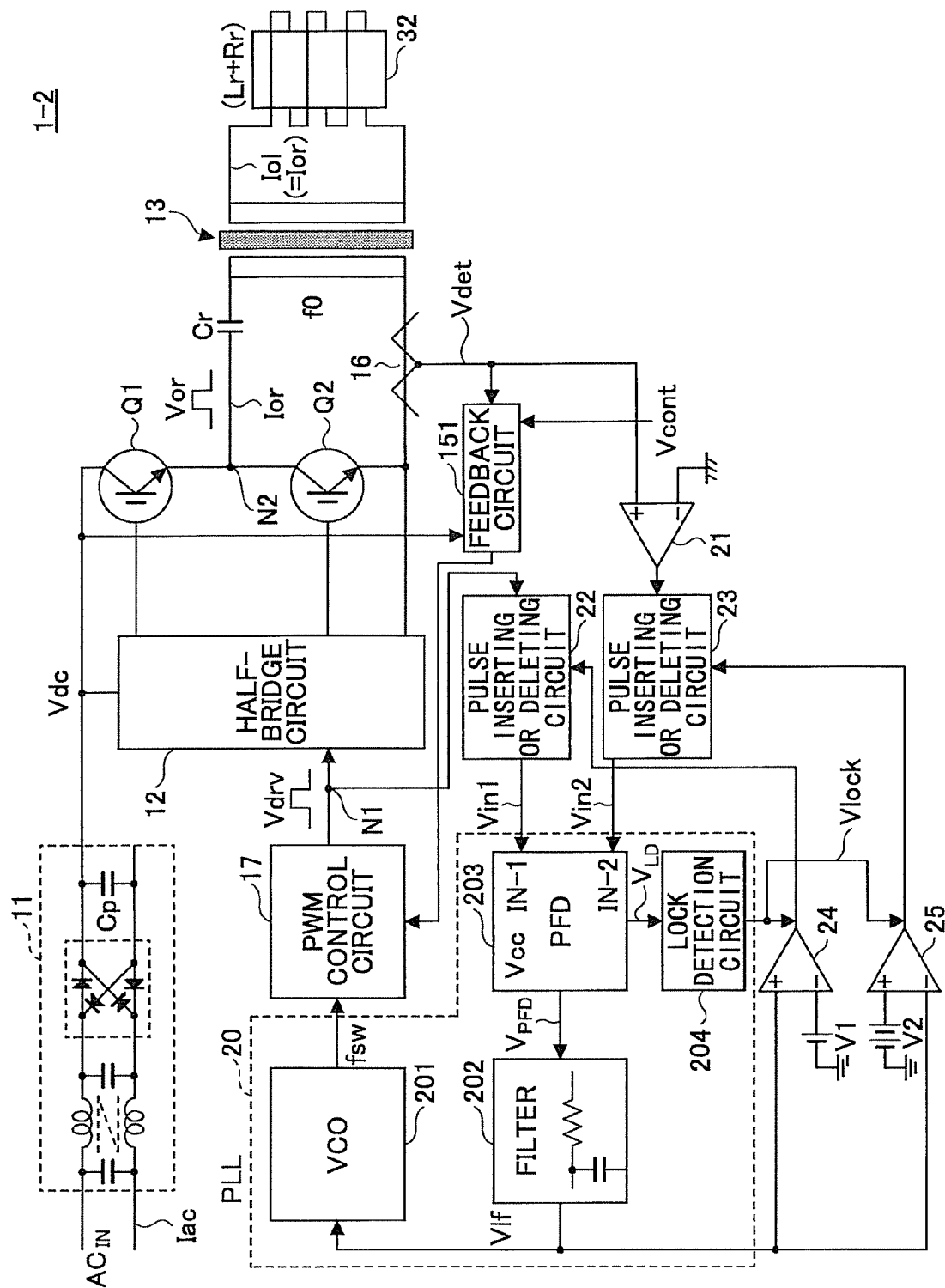
FIG. 24 is a block diagram illustrating an example of the power converter.

FIG. 24 is a block diagram illustrating another example of a power converter that is arranged in accordance with at least some embodiments of the present disclosure. In this example, the power converter is formed by a half-bridge resonant high-frequency induction heating inverter 1-2. In FIG. 24, those parts that are the same as those corresponding parts in FIG. 1 are designated by the same reference numerals, and a description thereof will be omitted.

In FIG. 24, a high-frequency AC output may be produced on the secondary side, and a load 32 may include a resonant coil Lr and a resonant resistor Rr. In addition, a feedback circuit 151 may be configured to provide a negative feedback by a feedback signal to the PWM control circuit 17 in response to the detection voltage Vdet output from the current detection circuit 16, and thereby adjust the pulse width in order to maintain the high-frequency AC output constant regardless of the size of the load 32. The feedback circuit 151 may include an output varying function that is configured to vary the negative feedback to the PWM control circuit 17 in response to an external level control signal (or voltage) Vcont. Further, in order to improve the power factor of the AC power supply, the capacitance of a primary smoothing capacitor Cp within the primary rectifier circuit 11 may be set relatively small compared to that of the converter 1-1 illustrated in FIG. 1. A portion of the rectified DC voltage Vdc may be supplied to the feedback circuit 151 in order to adjust the variable negative feedback to the PWM control circuit 17, so that the envelope of the resonant current Ior may become similar to that of the rectified DC voltage Vdc. An output current Iol flowing through the load 32 may become equal to the resonant current Ior.

The inverter 1-2 employs a half-bridge structure and provide the half-bridge driver circuit 12. However, the inverter 1-2 may employ a full-bridge structure and provide a full-bridge driver circuit in place of the half-bridge driver circuit 12.

Figure 25:
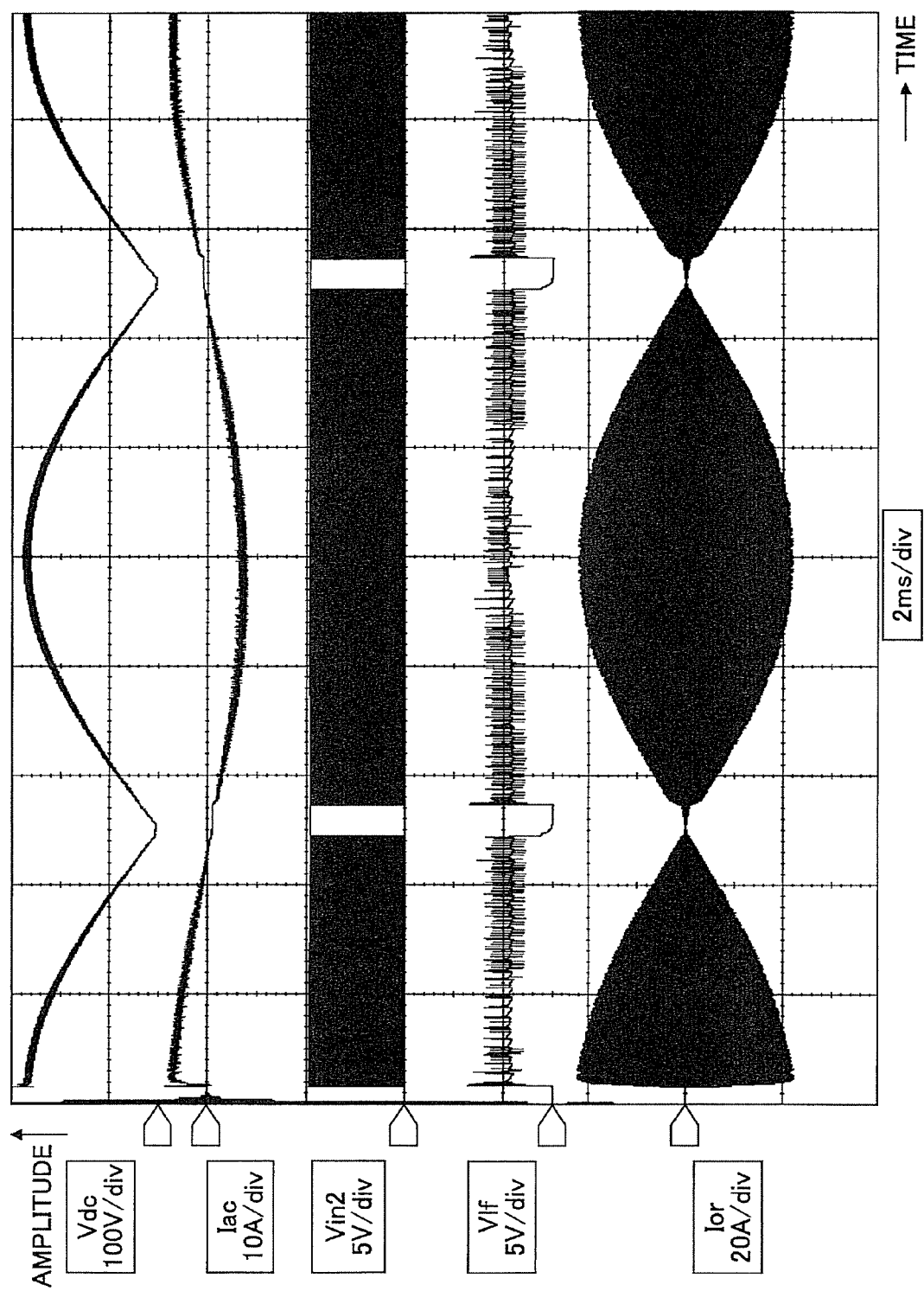
FIG. 25 is a diagram for explaining the recovery when pulses of the pulse input drop out in the inverter.

FIG. 25 is a diagram for explaining the recovery when pulses of the pulse input Vin2 drop out in the inverter 1-2. For example, the AC power supply may supply an AC voltage $AC_{IN}$ of 100 V/50 Hz, the switching frequency fsw may be approximately 80 kHz, the capacitance of the primary smoothing capacitor Cp may be 1 μF, and the resistance of the resonant resistor Rr may be 1Ω. In FIG. 25, the ordinate indicates the voltage or current amplitude, and the abscissa indicates the time. FIG. 25 illustrates the rectified DC voltage Vdc, a current Iac flowing through the primary rectifier circuit 11, the pulse input Vin2, the DC output Vlf of the loop filter circuit 202, and the resonant current Ior flowing from the node N2 towards the resonant coil Lr. The ordinate for the voltages Vdc, Vin2, and Vlf illustrates 5 V per division (5 V/div), the ordinate for the current Iac illustrates 10 A per division (10 A/div), and the ordinate for the resonant current Ior illustrates 20 A per division (20 A/div). The abscissa in FIG. 25 illustrates 2 msec per division (2 ms/div).

It may be seen from FIG. 25 that the DC output Vlf and the resonant current Ior may decrease in response to a dropout of the pulse in the pulse input Vin2, but the recovery process may quickly return the DC output Vlf and the resonant current Ior to their original levels. The recovery time may be 1 msec or less. The power factor may be approximately one (1), and the current Iac of the inverter 1-2 may include small harmonics.

Figure 26:
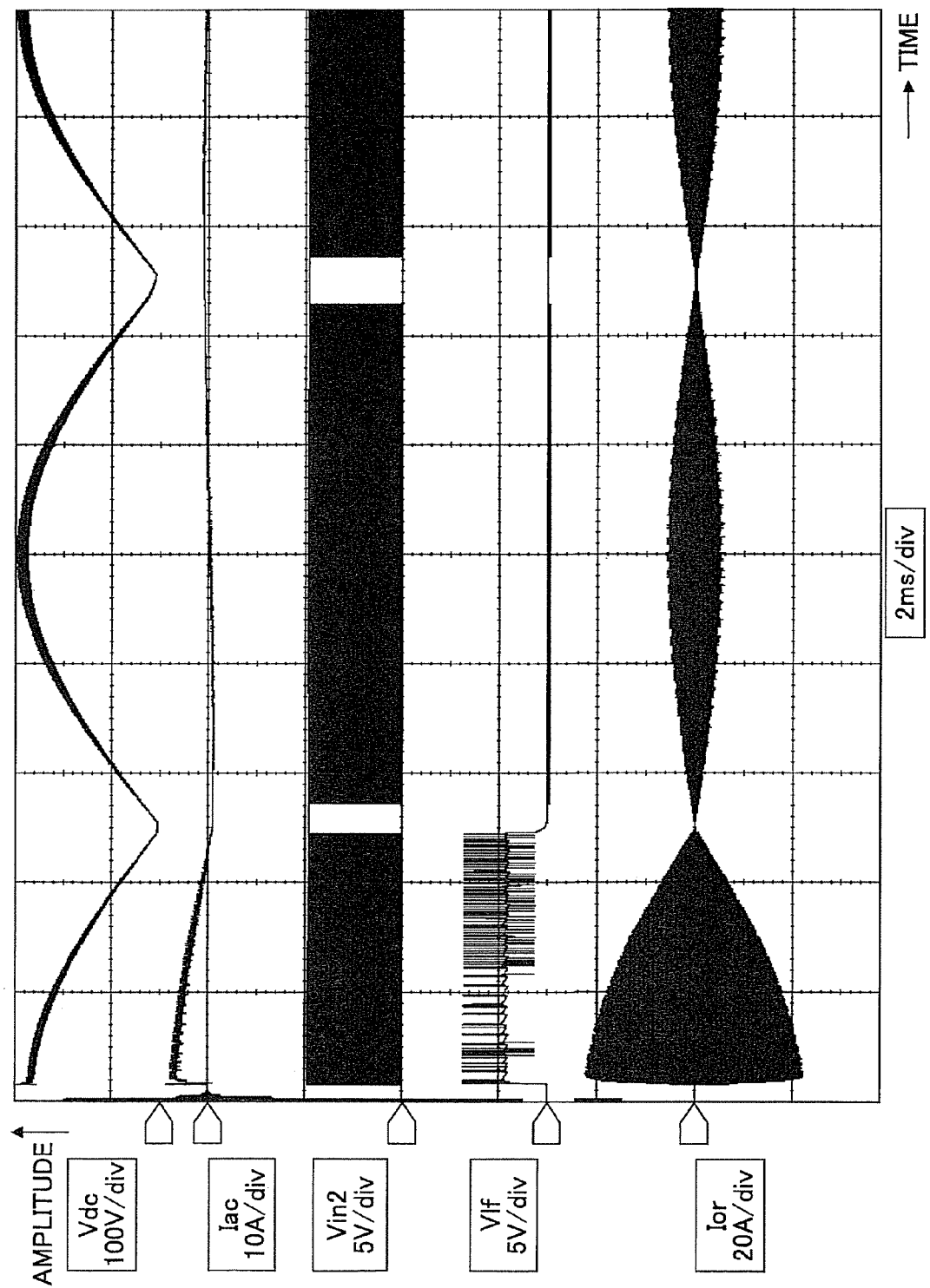
FIG. 26 is a diagram for explaining a comparison example of the inverter.

FIG. 26 is a diagram for explaining a comparison example of the inverter 1-2. It is assumed for the sake of convenience that the comparison example of the inverter 1-2 operates under comparable operating conditions as in FIG. 25 but does not carry out the recovery. In FIG. 26, the same designations are used as in FIG. 25. It may be seen from FIG. 26 that the DC output Vlf and the resonant current Ior may remain at the decreased levels after the dropout of the pulse in the pulse input Vin2 occurs, because no recovery process is carried out. Consequently, as may be seen from a comparison of FIG. 26 and FIG. 25, a considerable decrease may occur in the output of this comparison example of the inverter 1-2, because the output current Iol may be equal to the resonant current Ior.

In some example embodiments, one pulse of one of first and second pulse inputs to the PLL may be deleted when a filtered output obtained through phase detection in the PLL falls below a first reference level and an unlocked state of the PLL is detected in response to a phase lag of one of the first and second pulse inputs with respect to the other. On the other hand, one pulse of the other of the first and second pulse inputs may be deleted when the filtered output exceeds a second reference level and the unlocked state of the PLL is detected in response to a phase lead of the one of the first and second pulse inputs with respect to the other. However, two or more pulses of one of first and second pulse inputs to the PLL may be deleted when the filtered output obtained through phase detection in the PLL falls below the first reference level and the unlocked state of the PLL is detected in response to the phase lag of one of the first and second pulse inputs with respect to the other. In this case, two or more pulses of the other of the first and second pulse inputs may be deleted when the filtered output exceeds the second reference level and the unlocked state of the PLL is detected in response to the phase lead of the one of the first and second pulse inputs with respect to the other.

Furthermore, in some example embodiments, one or more pulses may be inserted into one of first and second pulse inputs to the PLL when the filtered output obtained through phase detection in the PLL falls below the first reference level and the unlocked state of the PLL is detected in response to the phase lag of one of the first and second pulse inputs with respect to the other. On the other hand, one or more pulses may be inserted into the other of the first and second pulse inputs when the filtered output exceeds the second reference level and the unlocked state of the PLL is detected in response to the phase lead of the one of the first and second pulse inputs with respect to the other.

In other words, the pulse inserting or deleting circuits 22 and 23 may delete or insert one or more pulses with respect to the pulse inputs Vin1 and Vin2 that are input to the input terminals IN-1 and IN-2 of the PFD 203. Hence, the insertion of one or more pulses with respect to the pulse input Vin1 or Vin2 may include inserting one or more non-zero pulses or high-level pulses, and is not limited to inserting one or more zero-pulses or low-level pulses to the pulse input Vin1 or Vin2 to substantially cancel or delete one or more pulses from the pulse input Vin1 or Vin2.

Figure 27:
FIG. 27 is a diagram for explaining deletion and insertion of pulses.
Figure 27:
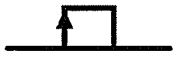
Figure 27:
Figure 27:

FIG. 27 is a diagram for explaining deletion and insertion of pulses by the pulse inserting or deleting circuits 22 and 23. In FIG. 27, it is assumed for the sake of convenience that one pulse is deleted or inserted with respect to the pulse input. As illustrated in FIG. 27, if the DC output Vlf of the loop filter circuit 202 is lower than the reference voltage V1, one pulse of the pulse input to the input terminal IN-1 of the PFD 203 may be deleted, so that the PFD circuit 203 may recover and return the PLL circuit 20 to the locked state at a rising edge of the next pulse input to the input terminal IN-2 of the PFD 203. If the DC output Vlf of the loop filter circuit 202 is greater than the reference voltage V2, one pulse of the pulse input to the input terminal IN-2 of the PFD 203 may be deleted, so that the PFD circuit 203 may recover and return the PLL circuit 20 to the locked state at a rising edge of the next pulse input to the input terminal IN-1 of the PFD 203.

On the other hand, if the DC output Vlf of the loop filter circuit 202 is lower than the reference voltage V1, one pulse may be inserted (or added) between two successive pulses of the pulse input to the input terminal IN-2 of the PFD 203, at a location where the duty ratio of the successive pulses changes, so that the RFD circuit 203 may recover and return the PLL circuit 20 to the locked state at a rising edge of the pulse immediately following the inserted pulse. If the DC output Vlf of the loop filter circuit 202 is greater than the reference voltage V2, one pulse may be inserted (or added) between two successive pulses of the pulse input to the input terminal IN-1 of the PFD 203, at a location where the duty ratio of the successive pulses changes, so that the PFD circuit 203 may recover and return the PLL circuit 20 to the locked state at a rising edge of the pulse immediately following the inserted pulse.

Figure 28:
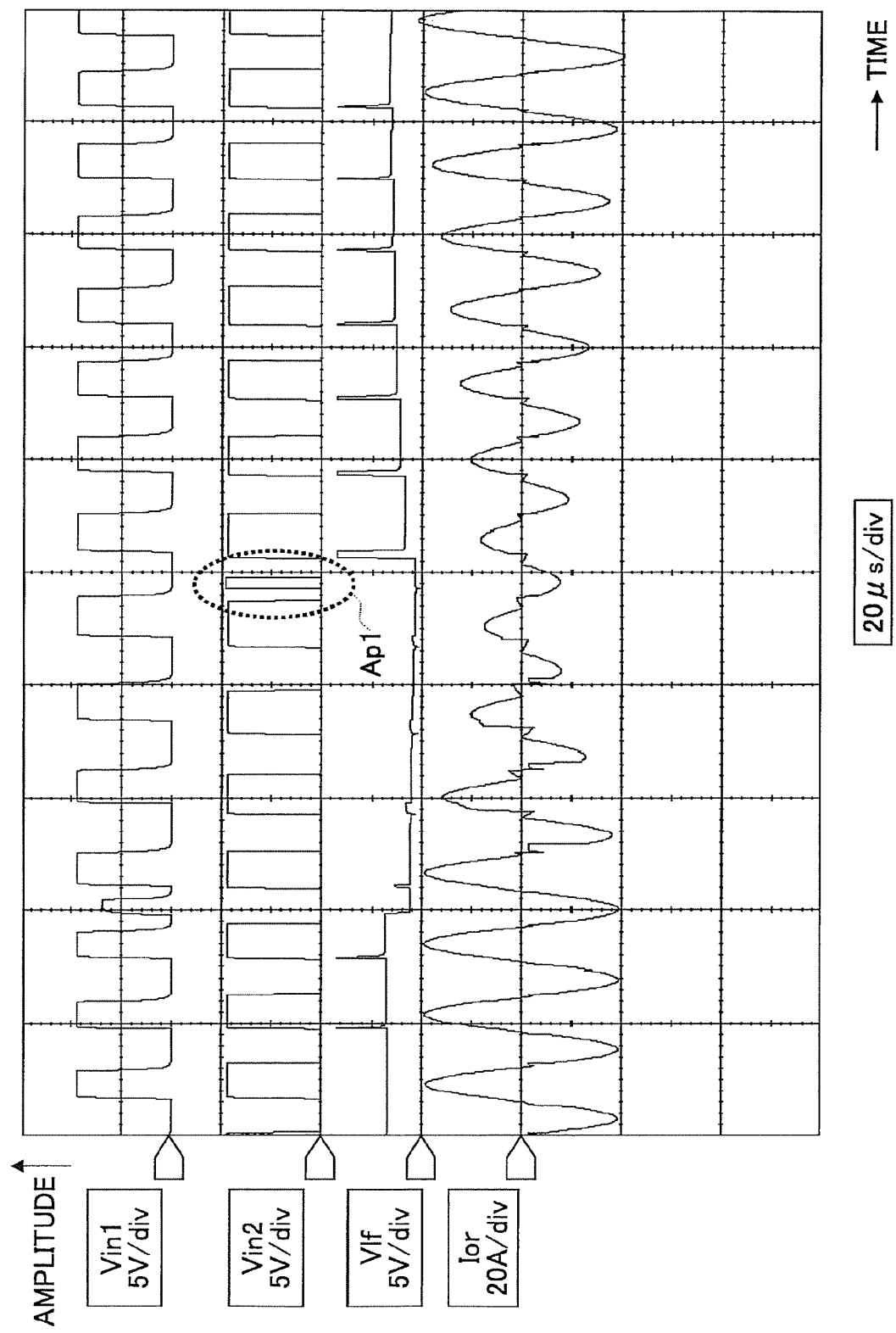
FIG. 28 is a diagram for explaining effects of the recovery for an example comparable to FIG. 8.

FIG. 28 is a diagram for explaining effects of the recovery for an example comparable to FIG. 8. In FIG. 28, the same designations are used as in FIG. 8. It may be seen from FIG. 28 that the insertion of a non-zero pulse at a location Ap1 indicated by dotted lines, where the duty ratio of the successive pulses changes, may return the PLL circuit 20 to the locked state in a relatively short recovery time.

Figure 29:
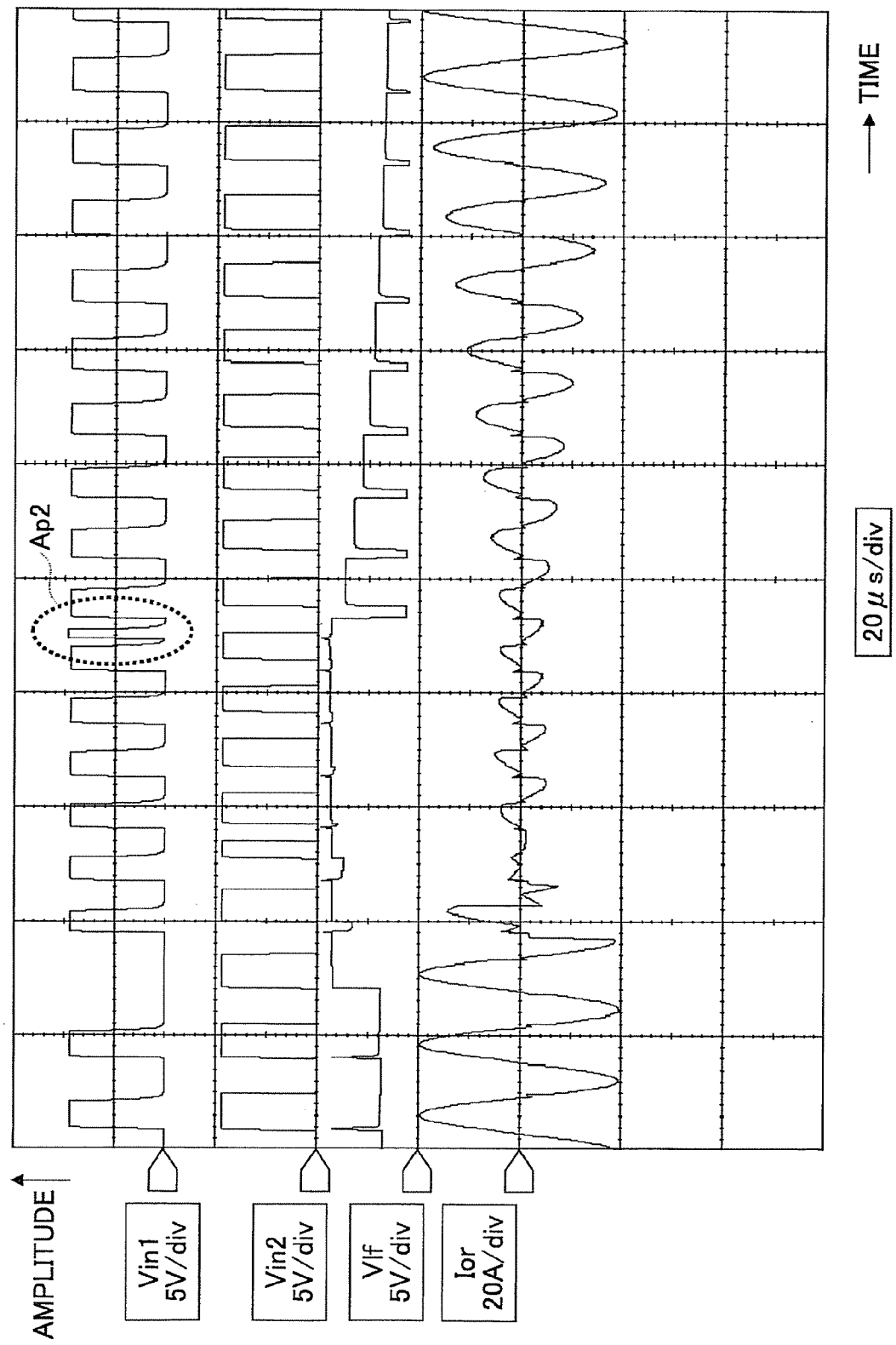
FIG. 29 is a diagram for explaining the recovery for an example comparable to FIG. 10, all arranged in accordance with at least some embodiments of the present disclosure.

FIG. 29 is a diagram for explaining the recovery for an example comparable to FIG. 10. In FIG. 29, the same designations are used as in FIG. 10. It may be seen from FIG. 29 that the insertion of a non-zero pulse at a location Ap2 indicated by dotted lines, where the duty ratio of the successive pulses changes, may return the PLL circuit 20 to the locked state in a relatively short recovery time.

References made in this disclosure to the term "responsive to" or "in response to" are not limited to responsiveness to a particular feature and/or structure. A feature may also be responsive to another feature and/or structure and also be located within that feature and/or structure. Moreover, when terms or phrases such as "coupled" or "responsive" or "in response to" or "in communication with", etc. are used herein or in the claims that follow, these terms should be interpreted broadly. For example, the phrase "coupled to" may refer to being communicatively, electrically and/or operatively coupled as appropriate for the context in which the phrase is used.

Those skilled in the art will recognize that it is common within the art to describe devices and/or processes in the fashion set forth herein, and thereafter use engineering practices to integrate such described devices (e.g., transmitters, receivers, wireless devices, computing platforms, computing devices, etc.) and/or methods into data processing systems. That is, at least a portion of the devices and/or methods described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available component, such as those typically found in data computing/communication and/or network computing/communication systems.

The herein described subject matter sometimes illustrates different components or elements contained within, or connected with, different other components or elements. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A converter comprising:
   a PLL (Phase-Locked Loop) circuit including a detector circuit, a lock detection circuit, a filter circuit and an oscillator circuit, wherein the detector circuit is configured to detect a phase error between a first pulse input and a second pulse input and to generate an error signal indicative of the detected phase error, the filter circuit is configured to filter the error signal and to provide a filtered error signal, the lock detection circuit is configured to detect a locked or unlocked state of the PLL circuit in response to the error signal, and the oscillator circuit is configured to produce an oscillator output signal in response to the filtered error signal;
   a pulse control circuit configured to receive the oscillator output signal and a feedback signal, and to generate a drive signal in response thereto;
   a comparator circuit configured to receive and evaluate the filtered error signal to determine when the filtered error signal either falls below a first reference level or exceeds a second reference level that is higher than the first reference level; and
   a pulse deleting circuit configured to receive the drive signal and to provide the first pulse input in response thereto, and also configured to receive a resonant current measurement from a primary side of a transformer circuit and to provide the second pulse input in response thereto,
   wherein the pulse deleting circuit is configured to delete one pulse of one of the first and second pulse inputs when the comparator circuit detects the filtered error signal falling below the first reference level and the lock detection circuit detects the unlocked state in response to a phase lag of the one of the first and second pulse inputs with respect to the other of the first and second pulse inputs detected by the detector circuit,
   and wherein the pulse deleting circuit is configured to delete one pulse of the other of the first and second pulse inputs when the comparator circuit detects that the filtered error signal exceeds the second reference level and the lock detection circuit detects the unlocked state in response to a phase lead of the one of the first and second pulse inputs with respect to the other of the first and second pulse inputs detected by the detector circuit.

2. The converter of claim 1, further comprising:
   a second comparator circuit configured to supply, to the pulse deleting circuit, an edge-triggered pulse signal having an edge occurring about a zero-crossing time of a resonant current of the resonant current measurement.

3. The converter of claim 1, further comprising:
   a feedback circuit configured to provide the feedback signal to the pulse control circuit in response to an output from a secondary side of the transformer circuit.

4. The converter of claim 1, further comprising:
   a feedback circuit configured to provide the feedback signal to the pulse control circuit in response to the resonant current measurement.

5. The converter of claim 4, wherein the feedback circuit includes an output varying function to vary the feedback signal in response to an external signal.

6. The converter of claim 1, wherein the secondary side of the transformer circuit corresponds to a DC output to be applied to a load.

7. The converter of claim 1, wherein the secondary side of the transformer circuit corresponds to an AC output to be applied to a load.

8. The converter of claim 1, further comprising:
   a switching circuit that is configured to drive the primary side of the transformer circuit to transmit power to the secondary side by alternately switching at a switching frequency of the drive signal,
   wherein the PLL circuit is configured to adapt the PLL operation to substantially match the switching frequency to a resonant frequency of the converter.

9. The converter of claim 8, further comprising:
   a second comparator circuit configured to supply, to the pulse deleting circuit, a first edge-triggered pulse signal having an edge occurring about a zero-crossing time of a resonant current of the resonant current measurement,
   wherein the pulse control circuit generates, as the drive signal, a second edge-triggered pulse signal having a phase substantially matching a phase of the first edge-triggered pulse signal.

10. A method to control a converter, the method comprising:
- receiving, by a pulse deleting circuit, a drive signal from a pulse control circuit and supplying a first pulse input in response thereto;
- receiving, by the pulse deleting circuit, a resonant current from a primary side of a transformer circuit and supplying a second pulse input in response thereto;
- detecting, by a comparator circuit, when a filtered error signal of a PLL (Phase-Locked Loop) circuit falls below a first reference level and asserting a first control signal in response thereto;
- detecting, by the comparator circuit, when the filtered error signal of the PLL circuit exceeds a second reference level that is higher than the first reference level, and asserting a second control signal in response thereto;
- detecting, by a lock detection circuit of the PLL circuit, an unlocked state of the PLL circuit in response to a phase lag or phase lead of one of the first and second pulse inputs with respect to the other of the first and second pulse inputs and asserting an unlock detection signal in response thereto;
- deleting, by the pulse deleting circuit, one pulse of one of the first and second pulse inputs based on the control signal and the unlock detection signal from the PLL circuit when the first control signal and the unlock detection signal are both asserted; and
- deleting, by the pulse deleting circuit, one pulse of the other of the first and second pulse inputs based on the control signal and the unlock detection signal from the PLL circuit when the second control signal and the unlock detection signal are both asserted.

11. The method of claim 10, further comprising:
supplying an edge-triggered pulse signal having an edge occurring about a zero-crossing time of the resonant current, from a second comparator circuit to the pulse deleting circuit.

12. The method of claim 10, further comprising:
providing a feedback signal to the pulse control circuit from a feedback circuit in response to an output from a secondary side of the transformer circuit.

13. The method of claim 10, further comprising:
providing a feedback signal to the pulse control circuit from a feedback circuit in response to the resonant current.

14. The method of claim 13, wherein the providing the feedback signal includes varying the feedback signal by an output varying function of the feedback circuit in response to an external signal.

15. The method of claim 10, further comprising:
applying a DC output, corresponding to a secondary side of the transformer circuit, to a load.

16. The method of claim 10, further comprising:
applying an AC output, corresponding to a secondary side of the transformer circuit, to a load.

17. The method of claim 10, further comprising:
- transmitting power to a secondary side of the transformer circuit by selectively actuating a switching circuit in response to a drive signal from the pulse control circuit; and
- adapting PLL operation by the PLL circuit to substantially match a switching frequency of the switching circuit to a resonant frequency of the converter.

18. The method of claim 17, further comprising:
- supplying a first edge-triggered pulse signal having an edge occurring about a zero-crossing time of the resonant current, from a second comparator circuit to the pulse deleting circuit; and
- generating, as the drive signal from the pulse control circuit, a second edge-triggered pulse signal having a phase substantially matching a phase of the first edge-triggered pulse signal.

19. A method to control a converter including a PLL (Phase-Locked Loop), the method comprising:
- deleting one pulse of one of first and second pulse inputs to the PLL when a filtered output obtained through phase detection in the PLL falls below a first reference level and an unlocked state of the PLL is detected in response to a phase lag of one of the first and second pulse inputs with respect to the other; and
- deleting one pulse of the other of the first and second pulse inputs when the filtered output exceeds a second reference level and the unlocked state of the PLL is detected in response to a phase lead of the one of the first and second pulse inputs with respect to the other.

20. The method of claim 19, wherein at least one of the deleting one pulse of the one of the first and second pulse inputs and the deleting one pulse of the other of the first and second pulse inputs deletes one pulse by inserting a zero-pulse or a low-level pulse to the one or the other of the first and second pulse inputs.

* * * * *

UNITED STATES PATENT AND TRADEMARK OFFICE
CERTIFICATE OF CORRECTION

PATENT NO.        : 8,379,412 B2
APPLICATION NO.   : 12/999628
DATED             : February 19, 2013
INVENTOR(S)       : Nakayama It is certified that error appears in the above-identified patent and that said Letters Patent is hereby corrected as shown below:

In the Specifications:

In Column 3, Line 13, delete "of first" and insert -- of the first --, therefor.

In Column 5, Line 46, delete "MOSFETs" and insert -- MESFETs --, therefor.

In Column 6, Line 8, delete "RFD" and insert -- PFD --, therefor.

In Column 8, Line 52, delete "return," and insert -- return --, therefor.

In Column 9, Line 21, delete "indicate" and insert -- indicates --, therefor.

In Column 10, Line 13, delete "vision" and insert -- division --, therefor.

In Column 11, Line 24, delete "vision" and insert -- division --, therefor.

In Column 12, Line 24, delete "vision" and insert -- division --, therefor.

In Column 12, Line 67, delete "for illustrates" and insert -- Ior illustrates --, therefor.

In Column 12, Line 67, delete "vision" and insert -- division --, therefor.

In Column 13, Line 35, delete "(50" and insert -- (200 --, therefor.

In Column 13, Line 43, delete "(50" and insert -- (200 --, therefor.

In Column 15, Line 17, delete "21," and insert -- 21 --, therefor.

In Column 15, Line 29, delete "from." and insert -- from --, therefor.

In Column 16, Line 39, delete "of first" and insert -- of the first --, therefor.

In Column 16, Line 50, delete "of first" and insert -- of the first --, therefor.

In Column 16, Line 62, delete "of first" and insert -- of the first --, therefor.

In Column 17, Line 37, delete "RFD" and insert -- PFD --, therefor.

In the Claims:

In Column 22, Line 29, in Claim 19, delete "of first" and insert -- of the first --, therefor.

Signed and Sealed this
Twenty-fifth Day of June, 2013

Teresa Stanek Rea
*Acting Director of the United States Patent and Trademark Office*